(12) United States Patent
Kim et al.

(10) Patent No.: US 11,024,691 B2
(45) Date of Patent: Jun. 1, 2021

(54) ELECTROLUMINESCENT DISPLAY DEVICE

(71) Applicant: LG Display Co., Ltd., Seoul (KR)

(72) Inventors: Gyungmin Kim, Paju-si (KR); HyeSeon Eom, Paju-si (KR); DooHyun Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/546,575

(22) Filed: Aug. 21, 2019

(65) Prior Publication Data
US 2020/0135829 A1 Apr. 30, 2020

(30) Foreign Application Priority Data
Oct. 30, 2018 (KR) ........................ 10-2018-0131046

(51) Int. Cl.
| | |
|---|---|
| H01L 27/32 | (2006.01) |
| G09G 3/20 | (2006.01) |
| G02B 27/01 | (2006.01) |
| G06F 1/16 | (2006.01) |
| H01L 27/12 | (2006.01) |

(52) U.S. Cl.
CPC ....... *H01L 27/3265* (2013.01); *G09G 3/2003* (2013.01); *H01L 27/3246* (2013.01); *H01L 27/3248* (2013.01); *H01L 27/3262* (2013.01); *G02B 27/0172* (2013.01); *G06F 1/163* (2013.01); *G09G 2300/0443* (2013.01); *H01L 27/1255* (2013.01); *H01L 27/322* (2013.01)

(58) Field of Classification Search
CPC ... H01L 33/486; H01L 33/502; H01L 33/505; H01L 33/507; H01L 33/54
See application file for complete search history.

(56) References Cited

U.S. PATENT DOCUMENTS

| | | | | |
|---|---|---|---|---|
| 6,078,367 | A * | 6/2000 | Satou | G02F 1/136213 |
| | | | | 349/46 |
| 9,935,163 | B2 * | 4/2018 | Han | H01L 27/3262 |
| 10,720,606 | B2 * | 7/2020 | Song | H01L 27/3218 |
| 2014/0299842 | A1 | 10/2014 | Kim et al. | |
| 2015/0338709 | A1 * | 11/2015 | Yoshida | G02F 1/13392 |
| | | | | 257/59 |
| 2016/0125789 | A1 | 5/2016 | Choi et al. | |
| 2018/0013086 | A1 * | 1/2018 | Chou | H01L 51/5012 |

FOREIGN PATENT DOCUMENTS

EP        2 207 205 A2     7/2010

* cited by examiner

*Primary Examiner* — Zandra V Smith
*Assistant Examiner* — Andre C Stevenson
(74) *Attorney, Agent, or Firm* — Birch, Stewart, Kolasch & Birch, LLP

(57) ABSTRACT

Discussed is an electroluminescent display device, wherein a first electrode of a first sub pixel includes a first lower electrode and a first upper electrode, a first electrode of a second sub pixel includes a second lower electrode and a second upper electrode, a first electrode of a third sub pixel includes a third lower electrode and a third upper electrode, a distance between the first lower electrode and the first upper electrode, a distance between the second lower electrode and the second upper electrode, and a distance between the third lower electrode and the third upper electrode are different from one another, the third upper electrode includes a third lower layer and a third upper layer, and the third lower layer is formed in the same pattern as that of the third lower electrode in an upper surface of the third lower electrode.

20 Claims, 15 Drawing Sheets ly, the present disclosure is directed to provid- 45# ELECTROLUMINESCENT DISPLAY DEVICE

CROSS-REFERENCE TO RELATED APPLICATIONS

This application claims the priority benefit of the Korean Patent Application No. 10-2018-0131046 filed on Oct. 30, 2018, which is hereby incorporated by reference as if fully set forth herein.

BACKGROUND

Field of the Invention

The present disclosure relates to an electroluminescent display device.

Discussion of the Related Art

An electroluminescent display device is provided in such a way that an emission layer is provided between an anode electrode and a cathode electrode, and the emission layer emits light by an electric field generated between the above two electrodes, to thereby display an image.

The emission layer can be formed of an organic material which emits light when exciton is produced by a bond of electron and hole, and the exciton falls to a ground state from an excited state, or can be formed of an inorganic material such as quantum dot.

The electroluminescent display device includes an emission layer provided by each individual sub pixel. Also, the individual sub pixel includes a driving thin film transistor configured to generate a light emission in the emission layer, and a capacitor configured to maintain a voltage supplied to the driving thin film transistor for one frame period.

In this case, it is necessary to increase a capacitance of the capacitor in order to improve the voltage maintenance properties by each individual sub pixel. However, an area of the sub pixel has to be increased so as to improve the capacitance. Thus, it has limitations on realizing an ultra-high resolution display device.

SUMMARY

Accordingly, the present disclosure is directed to providing an electroluminescent display device that substantially obviates one or more problems due to limitations and disadvantages of the related art.

An aspect of the present disclosure is directed to providing an electroluminescent display device which is capable of improving a capacitance in a capacitor without increasing an area of a sub pixel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescent display device comprising a substrate including a first sub pixel and a second sub pixel which are adjacent to each other, a driving thin film transistor provided in each of the first sub pixel and the second sub pixel, and configured to include a gate electrode, a source electrode, and a drain electrode, a first capacitor electrically connected with gate and source electrodes of the driving thin film transistor provided in the first sub pixel, and a second capacitor electrically connected with gate and source electrodes of the driving thin film transistor provided in the second sub pixel, wherein the first capacitor extends from the first sub pixel to the second sub pixel, and the second capacitor extends from the second sub pixel to the first sub pixel.

In another aspect of the present disclosure, there is provided an electroluminescent display device comprising a substrate including a first sub pixel and a second sub pixel which are adjacent to each other, a driving thin film transistor provided in each of the first sub pixel and the second sub pixel, and configured to include a gate electrode, a source electrode, and a drain electrode, a first capacitor electrically connected with gate and source electrodes of the driving thin film transistor provided in the first sub pixel, and a second capacitor electrically connected with gate and source electrodes of the driving thin film transistor provided in the second sub pixel, wherein the first capacitor is overlapped with the second capacitor in the first sub pixel, and the first capacitor is overlapped with the second capacitor in the second sub pixel.

According to one embodiment of the present disclosure, each of the first capacitor and the second capacitor is provided in all the first sub pixel and the second sub pixel so that it is possible to improve the capacitance in the first capacitor and the second capacitor without increasing an area of the first sub pixel and an area of the second sub pixel. Thus, it is possible to realize an ultra high resolution in the electroluminescent display device according to the present disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 2 illustrates remaining structures except a capacitor in the circuit diagram of FIG. 1B, FIG. 3 illustrates a structure obtained by additionally providing a first capacitor to FIG. 2, and FIG. 4 illustrates a structure obtained by additionally providing a second capacitor to FIG. 3;

FIGS. 8 to 10 are plane views illustrating the electroluminescent display device according to another embodiment of the present disclosure, wherein FIG. 8 illustrates remaining structures except a capacitor in the circuit diagram of FIG. 7B, FIG. 9 illustrates a structure obtained by additionally providing a first capacitor to FIG. 8, and FIG. 10 illustrates a structure obtained by additionally providing a second capacitor to FIG. 9;

DETAILED DESCRIPTION OF THE DISCLOSURE

Figure 1A:
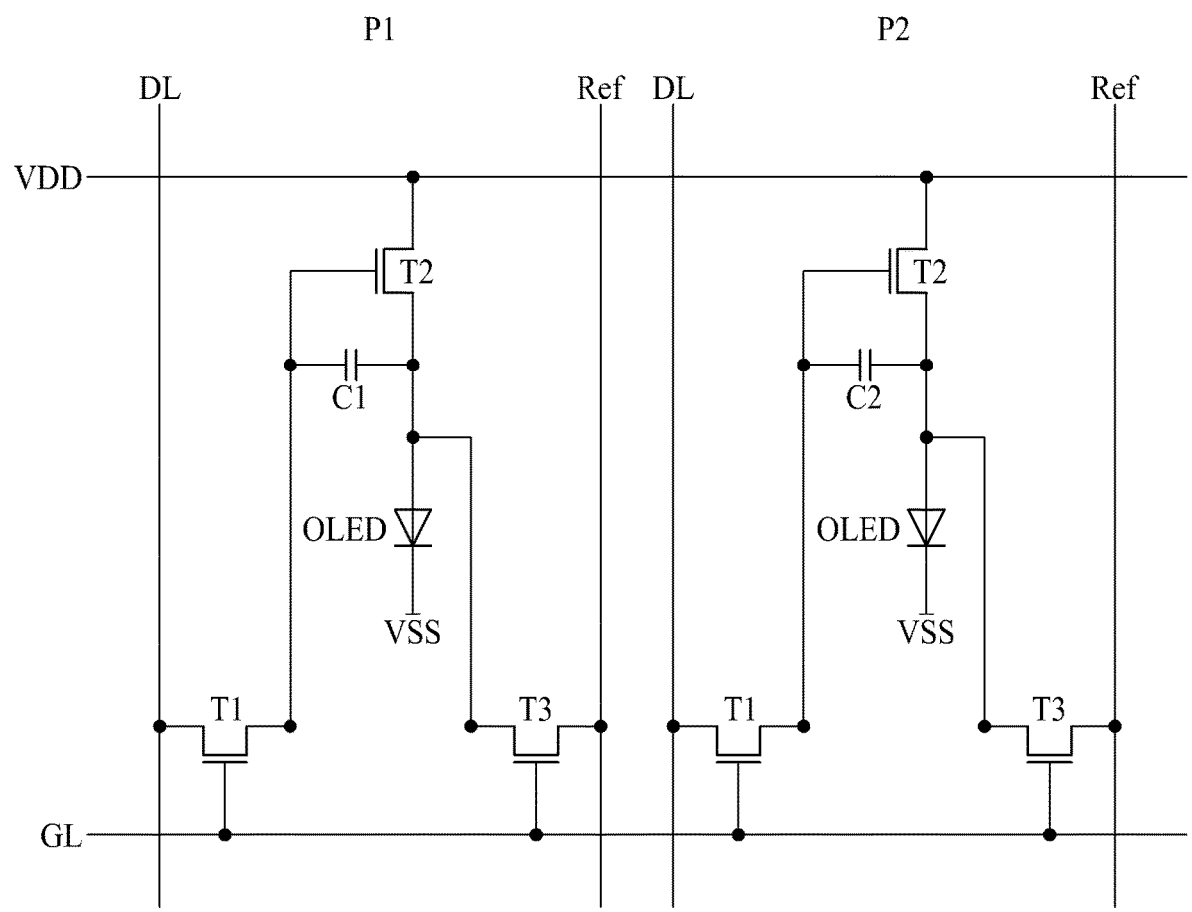
FIG. 1A is a circuit diagram illustrating an individual sub pixel of an electroluminescent display device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, exemplary embodiments of the present disclosure will be described in detail with reference to the accompanying drawings.

Figure 1B:
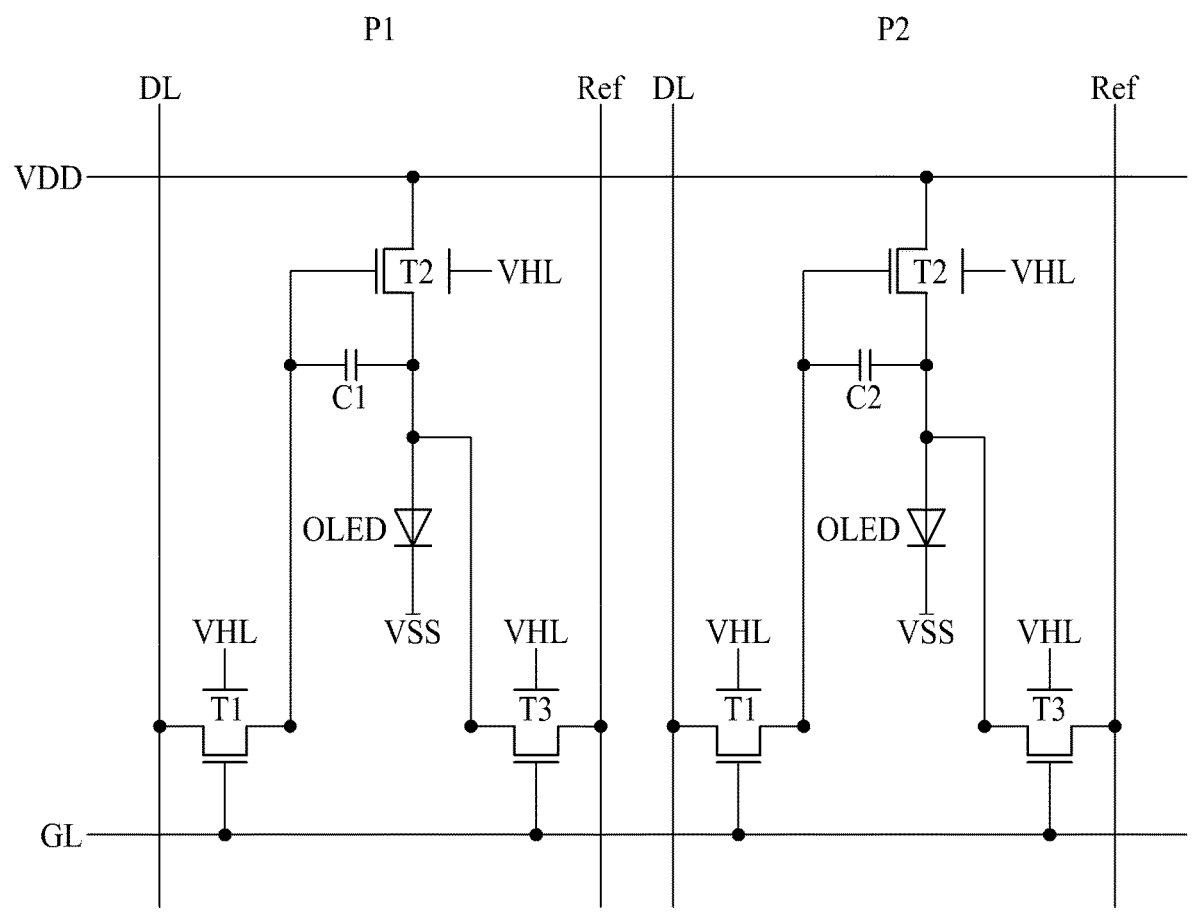
FIG. 1B is a circuit diagram illustrating an individual sub pixel of an electroluminescent display device according to another embodiment of the present disclosure.

FIG. 1A is a circuit diagram illustrating an individual sub pixel of an electroluminescent display device according to one embodiment of the present disclosure, and FIG. 1B is a circuit diagram illustrating an individual sub pixel of an electroluminescent display device according to another embodiment of the present disclosure. For convenience of explanation, FIGS. 1A and 1B show first and second sub pixels (P1, P2) disposed adjacent to each other. The first sub pixel (P1) can be any one among red, green, and blue sub pixels, and the second sub pixel (P2) can be another among the red, green, and blue sub pixels. The first or second sub pixel may be a white sub subpixel. All components of the electroluminescent display device according to all embodiments of the present disclosure are operatively coupled and configured.

As shown in FIG. 1A, each individual sub pixel (P1, P2) of the electroluminescent display device according to one embodiment of the present disclosure includes a gate line (GL), a high power source line (VDD), a data line (DL), and a reference line (Ref).

The gate line (GL) and the high power source line (VDD) are arranged in a first direction, for example, a horizontal direction while being apart from each other. The data line (DL) and the reference line (Ref) are arranged in a second direction, for example, a vertical direction while being apart from each other, wherein the second direction is different from the first direction.

Each of the first sub pixel (P1) and the second sub pixel (P2) is provided between one data line (DL) and another data line (DL). Thus, an interval between one data line (DL) and another data line (DL) defines a width of the first direction in the first sub pixel (P1) and the second sub pixel (P2). Each of the gate line (GL) and the high power source line (VDD) can be shared in the first sub pixel (P1) and the second sub pixel (P2).

However, the gate line (GL), the high power source line (VDD), the data line (DL), and the reference line (Ref) constituting the individual sub pixel (P1, P2) according to the present disclosure are not limited to the structure of FIG. 1A. An arrangement structure of the gate line (GL), the high power source line (VDD), the data line (DL), and the reference line (Ref) can be changed in various ways generally known to those in the art.

Each of the first sub pixel (P1) and the second sub pixel (P2) includes a switching thin film transistor (T1), a driving thin film transistor (T2), an initializing thin film transistor (T3), a capacitor (C1, C2), and a light emitting device such as an Organic Light-Emitting Diode (OLED). Each of the switching thin film transistor (T1), the driving thin film transistor (T2), and the initializing thin film transistor (T3) can be formed of an NMOS transistor or other types of transistor.

The switching thin film transistor (T1), which is switched by a gate signal supplied to the gate line (GL), supplies a data voltage, which is supplied from the data line (DL), to the driving thin film transistor (T2).

The driving thin film transistor (T2), which is switched by the data voltage supplied from the switching thin film transistor (T1), generates a data current from a power source supplied from the high power source line (VDD), and then supplies the generated data current to the light emitting device (OLED).

The initializing thin film transistor (T3) initializes a source voltage of the driving thin film transistor (T2), and removes charges from the light emitting device (OLED). The initializing thin film transistor (T3) supplies an initializing voltage, which is supplied from the reference line (Ref), to a source terminal of the driving thin film transistor (T2) in response to an initializing control signal supplied from the gate line (GL). In the drawings, the initializing control signal is supplied from the gate line (GL), but is not limited to this structure. In addition to the gate line (GL), an initializing control line for supplying the initializing control signal to the initializing thin film transistor (T3) can be additionally provided. The initializing thin film transistor (T3) can supply a current based on a property value of the driving thin film transistor (T2) to the reference line (Ref).

The capacitor (C1, C2) maintains the data voltage, which is supplied to the driving thin film transistor (T2), for one frame period. The capacitor (C1, C2) is connected with each of gate and source terminals of the driving thin film transistor (T2). The gate terminal of the driving thin film transistor (T2) is connected with a drain terminal of the switching thin film transistor (T1), and the source terminal of the driving thin film transistor (T2) is connected with an anode terminal of the light emitting device (OLED).

The capacitor (C1, C2) can include a first capacitor (C1) provided in the first sub pixel (P1), and a second capacitor (C2) provided in the second sub pixel (P2).

According to one embodiment of the present disclosure, the first capacitor (C1), which extends from the first sub pixel (P1) to the second sub pixel (P2), is overlapped with the first sub pixel (P1) and the second sub pixel (P2), and the second capacitor (C2), which extends from the second sub pixel (P2) to the first sub pixel (P1), is overlapped with the first sub pixel (P1) and the second sub pixel (P2) so that it is possible to increase a capacitance of the capacitor (C1, C2) without increasing the size of the sub pixel (P1, P2), which will be described in detail later.

The light emitting device (OLED) emits light in accordance with the data current supplied from the driving thin film transistor (T2). The light emitting device (OLED) can include an anode electrode connected with a source electrode of the driving thin film transistor (T2), and an organic emitting layer and a cathode electrode sequentially deposited on the anode electrode. The cathode electrode of the light emitting device (OLED) is connected with a low power source line (VSS).

FIG. 1B is a circuit diagram illustrating an individual sub pixel of an electroluminescent display device according to another embodiment of the present disclosure, which is obtained by additionally providing a voltage holding line (VHL) in FIG. 1A. If a semiconductor substrate such as silicon wafer is used for the electroluminescent display device according to the present disclosure, the voltage holding line (VHL) supplies a voltage for constantly maintaining a voltage of the semiconductor substrate. Thus, the circuit diagram of FIG. 1B is not applied to a case of using a glass substrate or a plastic substrate.

Figure 2:
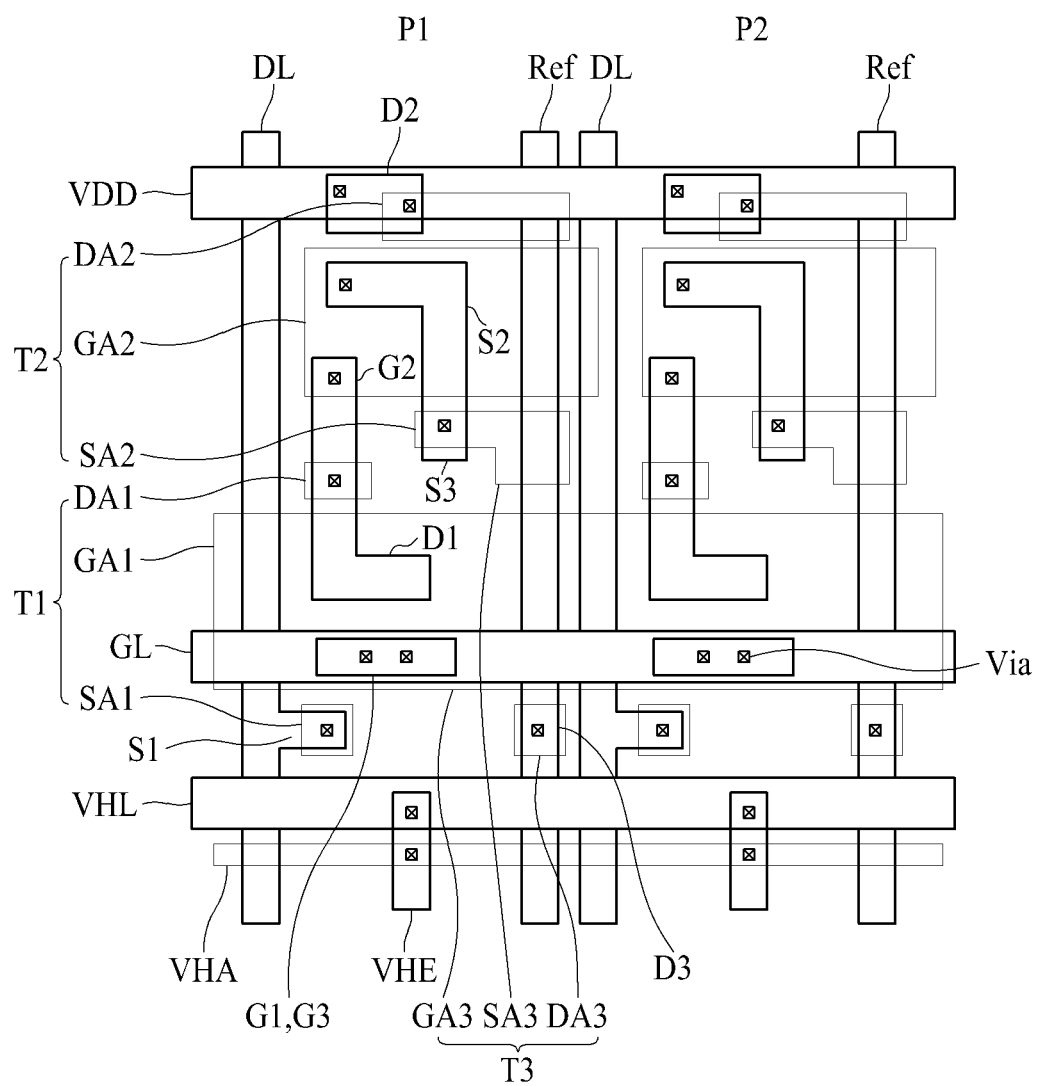
FIGS. 2 to 4 are plane views illustrating the electroluminescent display device according to one embodiment of the present disclosure, where
Figure 3:
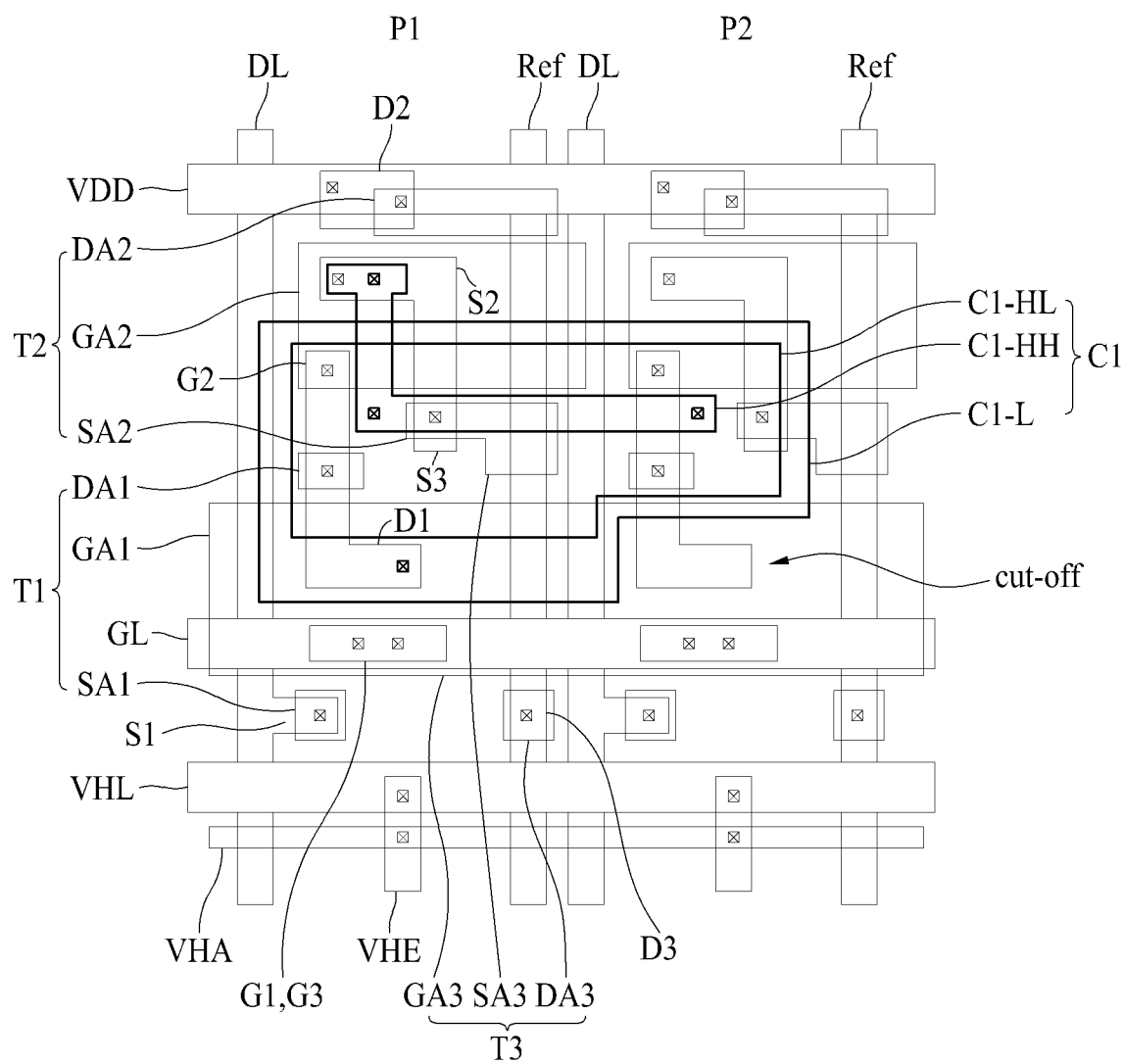
Figure 4:
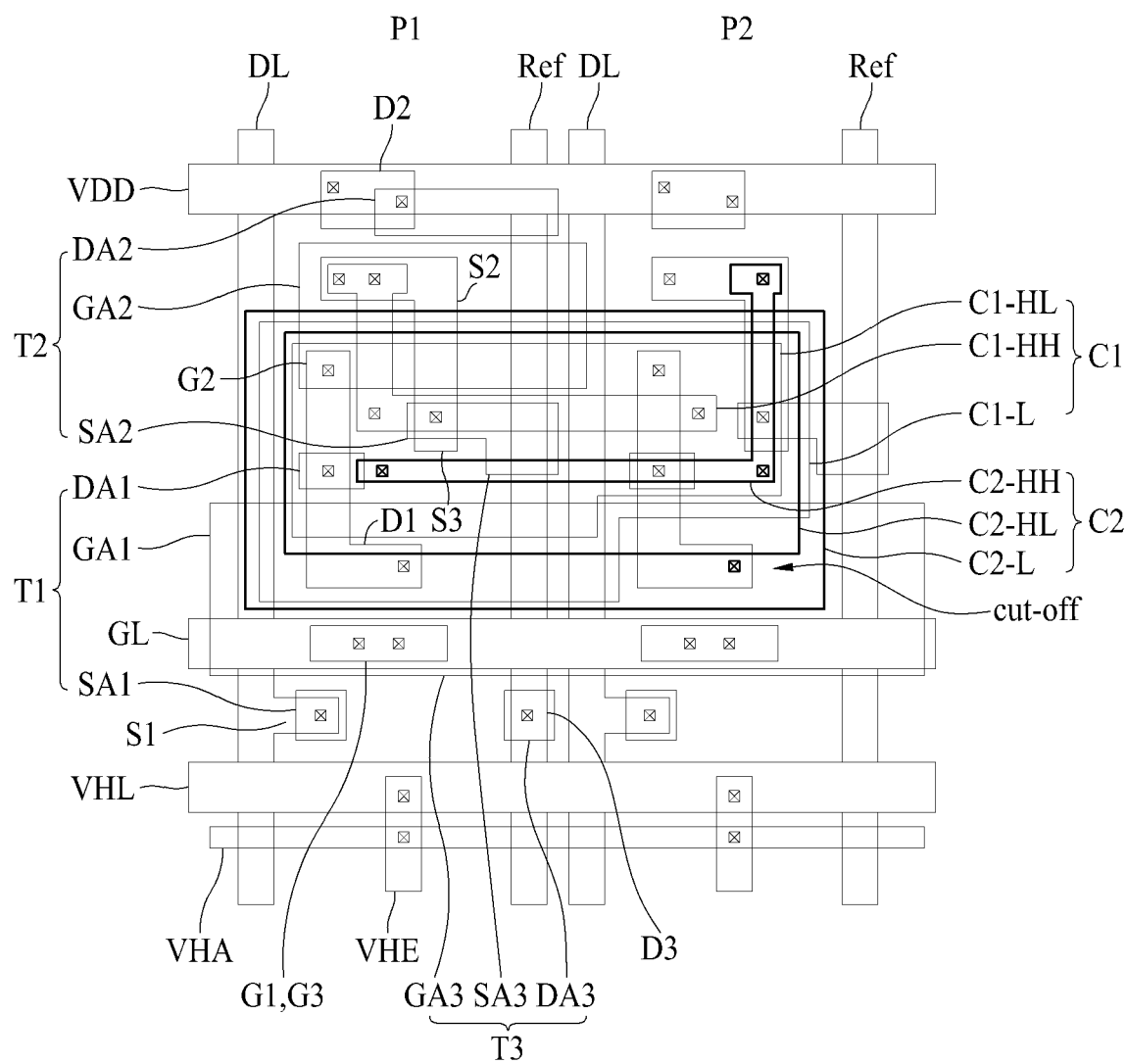

FIGS. 2 to 4 are plane views illustrating an electroluminescent display device according to one embodiment of the present disclosure, where FIG. 2 illustrates remaining structures except the capacitor (C1, C2) in the circuit diagram of FIG. 1B, FIG. 3 illustrates a structure obtained by additionally providing a first capacitor (C1) to FIG. 2, and FIG. 4 illustrates a structure obtained by additionally providing a second capacitor (C2) to FIG. 3.

First, a structure of the thin film transistor (T1, T2, T3) provided in each of first and second sub pixels (P1, P2) which are adjacent to each other will be described with reference to FIG. 2, and an overlap structure between the capacitor (C1, C2) and each of the first and second sub pixels (P1, P2) will be described with reference to FIGS. 3 and 4.

As shown in FIG. 2, the high power source line (VDD), the gate line (GL), and the voltage holding line (VHL) are arranged in a first direction, for example, a horizontal direction, and the data line (DL) and the reference line (Ref) are arranged in a second direction, for example, a vertical line.

As described above, the high power source line (VDD) supplies power source to the driving thin film transistor (T2) of the individual sub pixel (P1, P2), the gate line (GL) supplies the gate signal to the switching thin film transistor (T1) of the individual sub pixel (P1, P2) and also supplies the initializing control signal to the initializing thin film transistor (T3) of the individual sub pixel (P1, P2), the data line (DL) supplies the data voltage to the switching thin film transistor (T1) of the individual sub pixel (P1, P2), and the reference line (Ref) supplies the initializing voltage to the initializing thin film transistor (T3) of the individual sub pixel (P1, P2).

If the semiconductor substrate such as silicon wafer is used for the electroluminescent display device according to the present disclosure, the voltage holding line (VHL) supplies the voltage for constantly maintaining the voltage of the semiconductor substrate. If an insulating substrate such as glass or plastic is used for the electroluminescent display device according to the present disclosure, the voltage holding line (VHL) can be omitted.

In the individual sub pixel (P1, P2), there are the switching thin film transistor (T1), the driving thin film transistor (T2), and the initializing thin film transistor (T3).

The switching thin film transistor (T1) includes a first gate area (GA1), a first source area (SA1), and a first drain area (DA1).

The first gate area (GA1) is connected with a first gate electrode (G1) through a via (x) (e.g., via hole), and the first gate electrode (G1) is connected with the gate line (GL) through the via (x). Thus, the gate signal supplied to the gate line (GL) is supplied to the first gate area (GA1) via the first gate electrode (G1). The first gate electrode (G1) is patterned in the individual sub pixel (P1, P2) while being overlapped with the gate line (GL). The first gate area (GA1) can be consecutively extending from the first sub pixel (P1) to the second sub pixel (P2) while being overlapped with the first gate electrode (G1) and the gate line (GL).

The first source area (SA1) can be connected with a first source electrode (S1) through the via (x), and the first source electrode (S1) can be diverged from the data line (DL). Thus, the data signal supplied to the data line (DL) can be supplied to the first source area (SA1) via the first source electrode (S1). The first source area (SA1) can be patterned in the individual sub pixel (P1, P2) while being overlapped with the first source electrode (S1).

The first drain area (DA1) is connected with a first drain electrode (D1) through the via (x), and the first drain electrode (D1) is connected with the second gate electrode (G2) of the driving thin film transistor (T2). Thus, the data voltage which is switched by the switching thin film transistor (T1) is supplied to the second gate electrode (G2) via the first drain electrode (D1) in the first drain area (DA1). The first drain area (DA1) can be patterned in the individual sub pixel (P1, P2) while being overlapped with the first drain electrode (D1).

The driving thin film transistor (T2) can include a second gate area (GA2), a second source area (SA2), and a second drain area (DA2).

The second gate area (GA2) is connected with a second gate electrode (G2) through the via (x), and the second gate electrode (G2) is connected with the first drain electrode (D1). Thus, the data voltage of the first drain electrode (D1) is supplied as the gate signal of the second gate area (GA2) via the second gate electrode (G2). The second gate electrode (G2) can be formed as one body with the first drain electrode (D1), and the second gate area (GA2) can be patterned in the individual sub pixel (P1, P2) while being overlapped with the second gate electrode (G2). As shown in the drawings, the second gate area (GA2) can extend to the data line (DL) of the neighboring sub pixel (P1, P2).

The second source area (SA2) is connected with the second source electrode (S2) through the via (x), and the second source electrode (S2) is connected with the anode electrode through the via (x). Thus, the data current of the second source area (SA2) is supplied to the anode electrode via the second source electrode (S2). The second source area (SA2) and the second source electrode (S2) can be patterned in the individual sub pixel (P1, P2) while being overlapped with each other.

The second drain area (DA2) is connected with the second drain electrode (D2) through the via (x), and the second drain electrode (D2) can be connected with the high power source line (VDD) through the via (x). Thus, the power source supplied from the high power source line (VDD) is supplied to the second drain area (DA2) via the second drain electrode (D2). The second drain area (DA2) is patterned in the individual sub pixel (P1, P2) while being overlapped with the second drain electrode (D2), and the second drain electrode (D2) can be patterned in the individual sub pixel (P1, P2) while being overlapped with the high power source line (VDD).

The initializing thin film transistor (T3) includes a third gate area (GA3), a third source area (SA3), and a third drain area (DA3).

The third gate area (GA3) is connected with a third gate electrode (G3) through the via (x), and the third gate electrode (G3) is connected with the gate line (GL) through the via (x). Thus, the initializing control signal supplied to the gate line (GL) is supplied to the third gate area (GA3) via the third gate electrode (G3). The third gate area (G3) is formed as one body with the first gate area (GA1), and the third gate electrode (G3) can be formed as one body with the first gate electrode (G1). Thus, the third gate electrode (G3) can be patterned in the individual sub pixel (P1, P2) while being overlapped with the gate line (GL), and the third gate area (GA3) can be consecutively extending front the first sub pixel (P1) to the second sub pixel (P2) while being overlapped with the third gate electrode (G3) and the gate line (GL).

The third source area (SA3) is connected with the third source electrode (S3) through the via (x), and the third source electrode (S3) is connected with the second source electrode (S2). Thus, the data current of the second source electrode (S2) is supplied to the third source area (SA3) via the third source electrode (S3). The third source area (SA3) is formed as one body with the second source area (SA2), and the third source electrode (S3) can be formed as one body with the second source electrode (S2). Thus, the third source area (SA3) and the third source electrode (S3) can be patterned in the individual sub pixel (P1, P2) while being overlapped with each other.

The third drain area (DA3) is connected with the third drain electrode (D3) through the via (x), and the third drain electrode (D3) is connected with the reference line (Ref). Thus, the voltage supplied from the reference line (Ref) can be supplied to the third drain area (DA3) via the third drain electrode (D3). The third drain area (DA3) can be patterned in the individual sub pixel (P1, P2) while being overlapped with the third drain electrode (D3), and the third drain electrode (D3) can be formed as one body with the reference line (Ref). That is, one portion of the reference line (Ref) can function as the third drain electrode (D3).

Also, a voltage holding area (VHA) is provided in the individual sub pixel (P1, P2), the voltage holding area (VHA) is connected with a voltage holding electrode (VHE) through the via (x), and the voltage holding electrode (VHE) is connected with the voltage holding line (VHL) through the via (x). Thus, the voltage supplied through the voltage holding line (VHL) is supplied to the voltage holding area (VHA) via the voltage holding electrode (VHL). The voltage holding area (VHA) can be extending from the first sub pixel (P1) to the second sub pixel (P2) while being in parallel with the voltage holding line (VHL) and being spaced apart from the voltage holding line (VHL), or can be extending from the first sub pixel (P1) to the second sub pixel (P2) while being in parallel with the voltage holding line (VHL) and being overlapped with the voltage holding line (VHL), and the voltage holding electrode (VHL) can be patterned in the individual sub pixel (P1, P2).

As shown in FIG. 3, the first capacitor (C1) is provided in the first sub pixel (P1).

The first capacitor (C1) includes a first capacitor lower electrode (C1-L) and a first capacitor upper electrode (C1-HL, C1-HH).

The first capacitor lower electrode (C1-L) is connected with the second gate electrode (G2) of the first sub pixel (P1) through the via (x). The first capacitor lower electrode (C1-L) is extending from the first sub pixel (P1) to the second sub pixel (P2) while being overlapped with live first sub pixel (P1) and the second sub pixel (P2). Especially, the first capacitor lower electrode (C1-L), which extends from the first sub pixel (P1) to the second sub pixel (P2), is formed in a rectangular structure, however, a cut-off area is provided in the second sub pixel (P2). That is, the first capacitor lower electrode (C1-L) is not formed in the cut-off area, wherein the cut-off area is the area wherein a second capacitor lower electrode (C2-L), which will be explained later, is connected with the second gate electrode (G2) of the second sub pixel (P2) through the via (x). Thus, it is possible to prevent a short between the first capacitor lower electrode (C1-L) and the second capacitor lower electrode (C2-L) through the cut-off area.

The first capacitor upper electrode (C1-HL, C1-HH) includes a first lower layer (C1-HL) and a first upper layer (C1-HH). The first lower layer (C1-HL) is connected with the first upper layer (CH-HH) through the via (x) provided in the first sub pixel (P1) and the second sub pixel (P2), and the first upper layer (C1-HH) can be connected with the second source electrode (S2) of the first sub pixel (P1) through the via (x) provided in the first sub pixel (P1). Thus, the first lower layer (C-HL) is connected with the second source electrode (S2) of the first sub pixel (P1) through the first upper layer (C1-HH).

According to one embodiment of the present disclosure, the first capacitor upper electrode (C1-HL, C1-HH) includes the first lower layer (C1-HL) and the first upper layer (C1-HH), whereby it is possible to increase a capacitance of the first capacitor (C1) by decreasing a distance between the first capacitor upper electrode (C1-HL, C1-HH) and the first capacitor lower electrode (C1-L), but is not limited to this structure. The first capacitor upper electrode (C1-HL, C1-HH) can be formed of one electrode layer connected with the second source electrode (S2) of the first sub pixel (P1).

The first lower layer (C1-HL) and the first upper layer (C1-HH) are extending from the first sub pixel (P1) to the second sub pixel (P2) while being overlapped with the first sub pixel (P1) and the second sub pixel (P2). However, the first upper layer (C1-HH) can be not extending to the second sub pixel (P2). An area of the first lower layer (C1-HL) is relatively larger than an area of the first upper layer (C1-HH) so that it is possible to increase a capacitance of the first capacitor (C1). Meanwhile, the area of the first lower layer (C1-HL) is relatively smaller than an area of the first capacitor lower electrode (C1-L), but is not limited to this structure.

Meanwhile, the first capacitor upper electrode (C1-HL, C1-HH) is connected with the second gate electrode (G2) of the first sub pixel (P1) through the via (x), and the first capacitor lower electrode (C1-L) can be connected with the second source electrode (S2) of the first sub pixel (P1) through the via (x).

As shown in FIG. 4, the second capacitor (C2) is provided in the second sub pixel (P2). The second capacitor (C2) is overlapped with the first capacitor (C1). To this end, the second capacitor (C2) and the first capacitor (C1) can be provided in the different layers from each other.

The second capacitor (C2) includes a second capacitor lower electrode (C2-L) and a second capacitor upper electrode (C2-HL, C2-HH).

The second capacitor lower electrode (C2-L) is connected with the second gate electrode (G2) of the second sub pixel (P2) through the via (x) in the cut-off area of the first capacitor lower electrode (C1-L). The second capacitor lower electrode (C2-L) is extending from the second sub pixel (P2) to the first sub pixel (P1) while being overlapped with the first sub pixel (P1) and the second sub pixel (P2). Especially, the second capacitor lower electrode (C2-L), which extends from the second sub pixel (P2) to the first sub pixel (P1), is formed in a rectangular structure, and a cut-off area is not provided in the second capacitor tower electrode (C2-L) unlike the first capacitor lower electrode (C1-L). Accordingly, an area of the second capacitor lower electrode (C2-L) can be relatively larger than an area of the first capacitor lower electrode (C1-L), but is not limited to this structure. The second capacitor lower electrode (C2-L) can be overlapped with the first capacitor lower electrode (C1-L) and the first capacitor upper electrode (C1-HL, C1-HH) constituting the first capacitor (C1).

The second capacitor upper electrode (C2-HL, C2-HH) includes a second lower layer (C2-HL) and a second upper layer (C2-HH). The second lower layer (C2-HL) is connected with the second upper layer (C2-HH) through the via (x) provided in the first sub pixel (P1) and the second sub pixel (P2), and the second upper layer (C2-HH) can be connected with the second source electrode (S2) of the second sub pixel (P2) through the via (x) provided in the second sub pixel (P2). Accordingly, the second lower layer (C2-HL) is connected with the second source electrode (S2) of the second sub pixel (P2) through the second upper layer (C2-HH).

According to one embodiment of the present disclosure, the second capacitor upper electrode (C2-HL, C2-HH) includes the second lower layer (C2-HL) and the second upper layer (C2-HH) so that it is possible to increase a capacitance of the second capacitor (C2) by decreasing a distance between the second capacitor upper electrode (C2-HL, C2-HH) and the second capacitor lower electrode (C2-L), but is not limited to this structure. The second capacitor upper electrode (C2-HL, C2-HH) can be formed as one electrode layer connected with the second source electrode (S2) of the second sub pixel (P2).

The second lower layer (C2-HL) and the second upper layer (C2-HH) are extending from the second sub pixel (P2) to the first sub pixel (P1) while being overlapped with the first sub pixel (P1) and the second sub pixel (P2). However, the second upper layer (C2-HH) can be not extending to the first sub pixel (P1). An area of the second lower layer (C2-HL) is relatively larger than an area of the second upper layer (C2-HH) so that it is possible to increase a capacitance of the second capacitor (C2). Meanwhile, the area of the second lower layer (C2-HL) can be relatively smaller than an area of the second capacitor lower electrode (C2-L), but is not limited to this structure.

The second lower layer (C2-HL) can be overlapped with the first capacitor lower electrode (C1-L) and the first capacitor upper electrode (C1-HL, C1-HH) constituting the first capacitor (C1). The second upper layer (C2-HH) is overlapped with the first lower layer (C1-HL) and the first capacitor lower electrode (C1-L) of the first capacitor (C1), but not overlapped with the first upper layer (C1-HH). However, the second upper layer (C2-HH) can be overlapped with the first upper layer (C1-HH).

Meanwhile, the second capacitor upper electrode (C2-HL, C2-HH) is connected with the second gate electrode (G2) of the second sub pixel (P2) through the via (x), and the second capacitor lower electrode (C2-L) can be connected with the second source electrode (S2) of the second sub pixel (P2) through the via (x).

Figure 5:
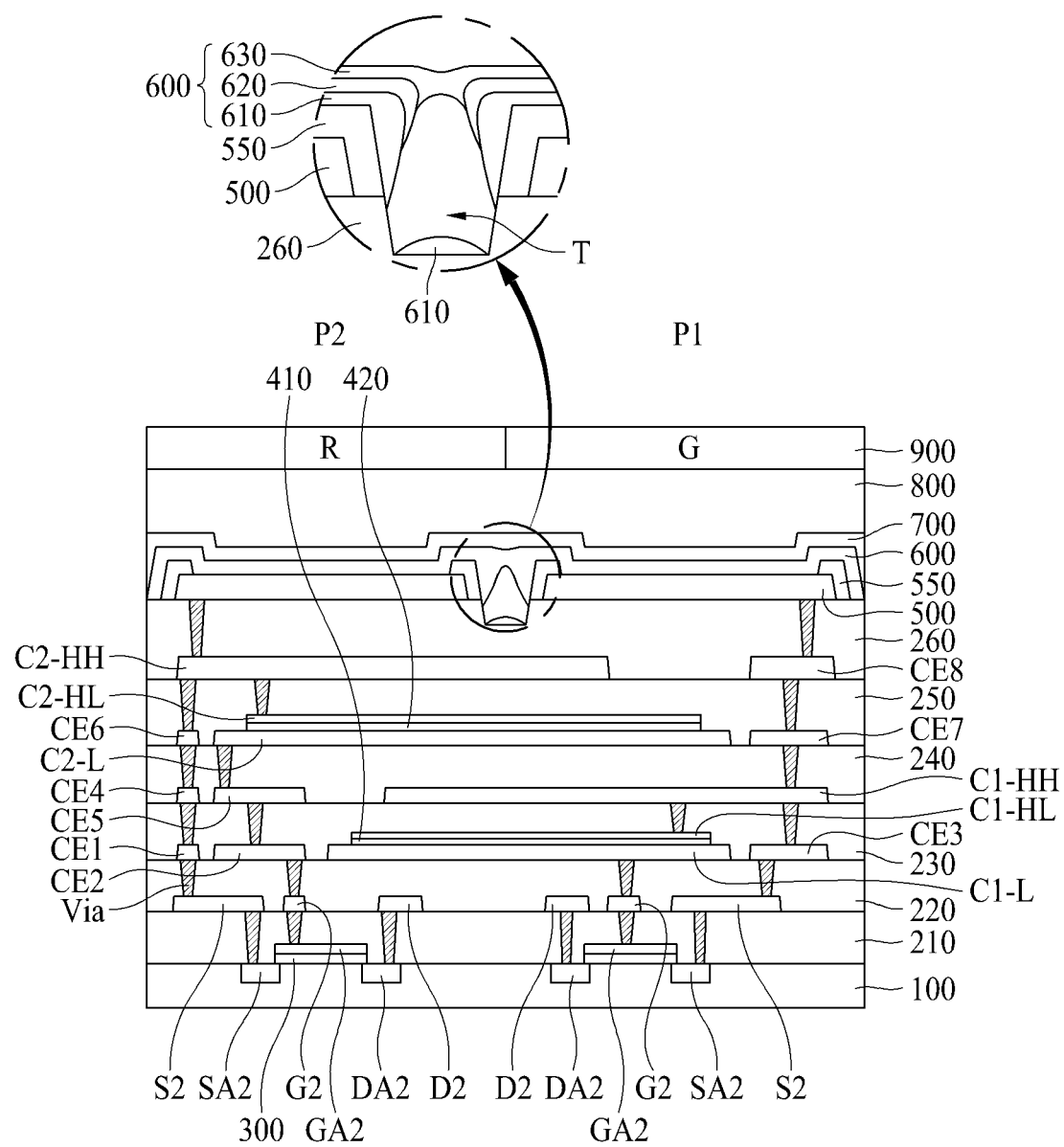
FIG. 5 is a cross sectional view illustrating a first sub pixel and a second sub pixel of the electroluminescent display device according to one embodiment of the present disclosure.

FIG. 5 is a cross sectional view illustrating the first sub pixel (P1) and the second sub pixel (P2) of the electroluminescent display device according to one embodiment of the present disclosure, which shows an electrical connection between the driving thin film transistor (T2) and the capacitor electrode (C1, C2) shown in FIGS. 2 to 4.

As shown in FIG. 5, the second source area (SA2) and the second drain area (DA2) are provided in the substrate 100. The second source area (SA1) and the second drain area (DA2) are provided in each of the first sub pixel (P1) and the second sub pixel (P2).

The substrate 100 can be formed of a P-type semiconductor, and the second source area (SA2) and the second drain area (DA2) can be formed of N-type doping areas obtained by doping predetermined areas of the substrate 100 with N-type dopant.

Between the second source area (SA2) and the second drain area (DA2), a gate insulating layer 300 is formed on the substrate 100, and the second gate area (GA2) is formed on the gate insulating layer 300. The gate insulating layer 300 and the second gate area (GA2) are formed in each of the first sub pixel (P1) and the second sub pixel (P2). The second gate area (GA2) can be formed of poly silicon, but is not limited to this material.

A first insulating layer 210 is formed on the second gate area (GA2), and the second source electrode (S2), the second gate electrode (G2), and the second drain electrode (D2) are formed on the first insulating layer 210. The second source electrode (S2), the second gate electrode (G2), and the second drain electrode (D2) are formed in each of the first sub pixel (P1) and the second sub pixel (P2).

The second source electrode (S2) is connected with the second source area (SA2) through the via penetrating through the first insulating layer 210, the second gate electrode (G2) is connected with the second gate area (GA2) through the via penetrating through the first insulating layer 210, and the second drain electrode (D2) is connected with the second drain area (DA2) through the via penetrating through the first insulating layer 210.

A second insulating layer 220 is formed on the second source electrode (S2), the second gate electrode (G2), and the second drain electrode (D2). Then, a first connection electrode (CE1), a second connection electrode (CE2), a third connection electrode (CE3), and the first capacitor lower electrode (C1-L) are formed on the second insulating layer 220. The first connection electrode (CE1) and the second connection electrode (CE2) are formed in the second sub pixel (P2), the third connection electrode (CE3) is formed in the first sub pixel (P1), and the first capacitor lower electrode (C1-L) extends from the first sub pixel (P1) to the second sub pixel (P2).

The first connection electrode (CE1) is connected with the second source electrode (S2) of the second sub pixel (P2) through the via penetrating through the second insulating layer 220, and the second connection electrode (CE2) is connected with the second gate electrode (G2) of the second sub pixel (P2) through the via penetrating through the second insulating layer 220. The third connection electrode (CE3) is connected with the second source electrode (S2) of the first sub pixel (P1) through the via penetrating through the second insulating layer 220, and the first capacitor lower electrode (C1-L) is connected with the second gate electrode (G2) of the first sub pixel (P1) through the via penetrating through the second insulating layer 220.

A first insulating inter layer 410 is formed on the first capacitor lower electrode (C1-L), and the lower layer (C1-HL) of the first capacitor upper electrode (C1-HL, C1-HH) is formed on the first insulating interlayer 410. The first insulating interlayer 410 and the lower layer (C1-HL) of the first capacitor upper electrode (C1-HL, C1-HH) extend from the first sub pixel (P1) to the second sub pixel (P2).

A third insulating layer 230 is formed on the lower layer (C1-HL) of the first capacitor upper electrode (C1-HL, C1-HH). Then, a fourth connection electrode (CE4), a fifth connection electrode (CE5), and the upper layer (C1-HH) of the first capacitor upper electrode (C1-HL, C1-HH) are formed on the third insulating layer 230. The fourth connection electrode (CE4) and the fifth connection electrode (CE5) are formed in the second sub pixel (P2), and the upper layer (C1-HH) of the first capacitor upper electrode (C1-HL, C1-HH) extends from the first sub pixel (P1) to the second sub pixel (P2).

The fourth connection electrode (CE4) is connected with the first connection electrode (CE1) of the second sub pixel (P2) through the via penetrating through the third insulating layer 230, and the fifth connection electrode (CE5) is connected with the second connection electrode (CE2) of the second sub pixel (P2) through the via penetrating through the third insulating layer 230. The upper layer (C1-HH) of the first capacitor upper electrode (C1-HL, C1-HH) is connected with the lower layer (C1-HL) of the first capacitor upper electrode (C1-HL, C1-HH) through the via penetrating through the third insulating layer 230.

Thus, the capacitance is generated between the first capacitor lower electrode (C1-L) and the lower layer (C1-HL) of the first capacitor upper electrode (C1-HL, C1-HH) which are spaced apart from each other with the first insulating interlayer 410 with a small thickness interposed in-between. In this case, a distance between the first capacitor lower electrode (C1-L) and the lower layer (C1-HL) of the first capacitor upper electrode (C1-HL, C1-HH), that is, the thickness of the first insulating interlayer 410 is shorter than a distance between the lower layer (C1-HL) of the first capacitor upper electrode (C1-HL, C1-HH) and the upper layer (C1-HH) of the first capacitor upper electrode (C1-HL, C1-HH), to thereby increase the capacitance.

However, if needed, it is possible to omit the via (e.g., via hole) provided to connect the lower layer (C1-HL) of the first capacitor upper electrode (C1-HL, C1-HH) with the upper layer (C1-HH) of the first capacitor upper electrode (C1-HL, C1-HH), the lower layer (C1-HL), and the first insulating interlayer 410. In this case, the capacitance can be generated between the first capacitor lower electrode (C1-L) and the upper layer (C1-HH) which are spaced apart from each other with the third insulating layer 230 interposed in-between.

A fourth insulating layer 240 is formed on the fourth connection electrode (CE4), the fifth connection electrode (CE5), and the upper layer (C1-HH). Then, a sixth connection electrode (CE6), a seventh connection electrode (CE7), and the second capacitor lower electrode (C2-L) are formed on the fourth insulating layer 240. The sixth connection electrode (CE6) is formed in the second sub pixel (P2), the seventh connection electrode (CE7) is formed in the first sub pixel (P1), and the second capacitor lower electrode (C2-L) extends from the second sub pixel (P2) to the first sub pixel (P1).

The sixth connection electrode (CE6) is connected with the fourth connection electrode (CE4) through the via penetrating through the fourth insulating layer 240, and the seventh connection electrode (CE7) is connected with the upper layer (C1-HH) of the first capacitor upper electrode (C1-HL, C1-HH) through the via penetrating through the fourth insulating layer 240. The second capacitor lower electrode (C2-L) is connected with the fifth connection electrode (CE5) through the via penetrating through the fourth insulating layer 240. Thus, the second capacitor lower electrode (C2-L) is connected with the second gate electrode (G2) of the second sub pixel (P2) via the fifth connection electrode (CE5) and rite second connection electrode (CE2).

A second insulating interlayer 420 is formed on the second capacitor lower electrode (C2-L), and the lower layer (C2-HL) of the second capacitor upper electrode (C2-HL, C2-HH) is formed on the second insulating interlayer 420. The second insulating inter layer 420 and the lower layer (C2-HL) of the second capacitor upper electrode (C2-HL, C2-HH) extend from the second sub pixel (P2) to the first sub pixel (P1).

A fifth insulating layer 250 is formed on the lower layer (C2-HL) of the second capacitor upper electrode (C2-HL, C2-HH). Then, an eighth connection electrode (CE8), and the upper layer (C2-HH) of the second capacitor upper electrode (C2-HL, C2-HH) are formed on the filth insulating layer 250. The eighth connection electrode (CE8) is formed in the first sub pixel (P1), and the upper layer (C2-HH) of the second capacitor upper electrode (C2-HL, C2-HH) extend from the second sub pixel (P2) to the first sub pixel (P1).

The eighth connection electrode (CE8) is connected with the seventh connection electrode (CE7) through the via penetrating through the fifth insulating layer 250, and the upper layer (C2-HH) of the second capacitor upper electrode (C2-HL, C2-HH) is connected with the lower layer (C2-HL) of the second capacitor upper electrode (C2-HL, C2-HH) through the via penetrating through the fifth insulating layer 250.

Thus, the capacitance is generated between the second capacitor lower electrode (C2-L) and the lower layer (C2-HL) of the second capacitor upper electrode (C2-HL, C2-HH) which are spaced apart from each other with the second insulating interlayer 420 with a small thickness interposed in-between.

In this case, a distance between the second capacitor lower electrode (C2-L) and the lower layer (C2-HL) of the second capacitor upper electrode (C2-HL, C2-HH), that is, the thickness of the second insulating interlayer 420 is shorter than a distance between the lower layer (C2-HL) of the second capacitor upper electrode (C2-HL, C2-HH) and the upper layer (C2-HH) of the second capacitor upper electrode (C2-HL, C2-HH), to thereby increase the capacitance.

However, if needed, it is possible to omit the via (e.g., via hole) provided to connect the lower layer (C2-HL) of the second capacitor upper electrode (C2-HL, C2-HH) with the upper layer (C2-HH) of the second capacitor upper electrode (C2-HL, C2-HH), the lower layer (C2-HL), and the second insulating interlayer 420. In this case, the capacitance can be generated between the second capacitor lower electrode (C2-L) and the upper layer (C2-HH) which are spaced apart from each other with the fifth insulating layer 250 interposed in-between.

A sixth insulating layer 260 is formed on the eighth connection electrode (CE8) and the second capacitor upper electrode (C2-HL, C2-HH), and a first electrode 500, which functions as an anode, is formed on the sixth insulating layer 260.

The first electrode 500 is formed in each of the first sub pixel (P1) and the second sub pixel (P2). The first electrode 500 of the first sub pixel (P1) is connected with the eighth connection electrode (CE8) through the via penetrating through the sixth insulating layer 260. Thus, the first electrode 500 of the first sub pixel (P1) is connected with the upper layer (C1-HH) of the first capacitor upper electrode (C1-HL, C1-HH) via the eighth connection electrode (CE8) and the seventh connection electrode (CE7). The first electrode 500 of the second sub pixel (P2) is connected with the upper layer (C2-HH) of the second capacitor upper electrode (C2-HL, C2-HH) through the via penetrating through the sixth insulating layer 260.

Both ends of the first electrode 500 are covered by a bank 550. The bank 550 is provided to cover both ends of the first electrode 500 on the sixth insulating layer 260, and is also provided in the boundary area between the first sub pixel (P1) and the second sub pixel (P2). Herein, an exposed area of the first electrode 500, which is exposed without being covered by the bank 550, becomes an emission area.

An emission layer 600 is formed on the first electrode 500. The emission layer 600 can be formed on the bank 550. That is, the emission layer 600 can be formed in each of the first sub pixel (P1) and the second sub pixel (P2), and the boundary area between the first sub pixel (P1) and the second sub pixel (P2).

The emission layer 600 can be provided to emit white colored light (W). To this end, the emission layer 600 can include a plurality of stacks configured to emit different colored light.

For example, the emission layer 600 can include a first stack 610 configured to emit blue colored light, a second stack 630 configured to emit yellow colored light, and a charge generation layer (CGL) 620 provided between the first stack 610 and the second stack 630. Each of the first stack 610 and the second stack 630 can be formed in a deposition structure obtained by sequentially depositing a hole transporting layer, an organic emitting layer, and an electron transporting layer. Although not shown, the emission layer 600 can include a first stack configured to emit blue colored light, a second stack configured to emit green colored light, a third stack configured to emit red colored light, a first charge generation layer provided between the first stack and the second stack, and a second charge generation layer provided between the second stack and the third stack. A structure of the emission layer 600 can be changed in various ways generally known to those in the art.

However, it is not limited to the above structures. The emission layer 600 can be provided to emit different colored light by each individual sub pixel (P1, P2).

According to one embodiment of the present disclosure, a trench (T) can be provided in the bank 550 and the sixth insulating layer 260, whereby the emission layer 600 can be provided in the trench (T). Thus, a long current path is formed between the neighboring first sub pixel (P1) and the second sub pixel (P2), to thereby reduce a leakage current generated between the first sub pixel (P1) and the second sub pixel (P2) which are adjacent to each other. The trench (T) can be formed only in the bank 500.

On the assumption that an interval between the first sub pixel (P1) and the second sub pixel (P2) becomes compact in order to realize a high resolution, if the emission layer 600 inside any one of the sub pixels (P1, P2) emits light, charges of the corresponding emission layer 600 can be transferred to another emission layer 600 of neighboring another sub pixel (P1, P2), whereby there is a possibility of leakage current.

Thus, according to one embodiment of the present disclosure, the trench (T) is formed in the boundary between the sub pixels (P1, P2), and the emission layer 600 is formed in the trench (T) so that it is possible to reduce a leakage current between the neighboring sub pixels (P1, P2).

The first stack 610 can be formed on an inner lateral surface of the trench (T), and can be formed on an inner lower surface of the trench (T). In this case, some area of the first stack 610 formed on the inner lateral surface of the trench (T) is disconnected from some area of the first stack 610 formed on the inner lower surface of the trench (T). Thus, some area of the first stack 610 formed on one lateral surface inside the trench (T), and more particularly, on the left lateral surface inside the trench (T) is not connected with some area of the first stack 610 formed on the other lateral surface inside the trench (T), and more particularly, on the right lateral surface inside the trench (T). Accordingly, charges are not transferred between the neighboring sub pixels (P1, P2) arranged with the trench (T) interposed in-between through the first stack 610.

Also, the charge generating layer 620 can be formed at the inner lateral surface of the trench (T) while being disposed on the first stack 610. In this case, some area of the charge generating layer 620 formed on one lateral surface inside the trench (T), and more particularly, on the left lateral surface inside the trench (T) is not connected with some area of the charge generating layer 620 formed on the other lateral surface inside the trench (T), and more particularly, on the right lateral surface inside the trench (T). Accordingly, charges are not transferred between the sub pixels (P1, P2) arranged with the trench (T) interposed in-between through the charge generating layer 620.

Also, the second stack 630 can be provided connectedly between the neighboring sub pixels (P1, P2) with the trench (T) interposed in-between while being disposed on the charge generating layer 620. Thus, charges can be transferred between the sub pixels (P1, P2) with the trench (T) interposed in-between through the second stack 630, but the invention is not limited to this structure. The second stack 630 can be provided disconnectedly between the neighboring sub pixels (P1, P2) with the trench (T) interposed in-between by appropriately adjusting a shape of the trench (T) and a deposition process of the emission layer 600. Especially, some lower portions of the second stack 630 being adjacent to the charge generation layer 620 can be disconnectedly provided between the sub pixels (P1, P2).

Conductivity of the charge generating layer 620 is higher than that of each of the first stack 610 and the second stack 630. Especially, an N-type charge generating layer of the charge generating layer 620 can comprise a metal material, whereby conductivity of the charge generating layer 620 is higher than that of each of the first stack 610 and the second stack 630. Thus, the charge transfer between the sub pixels (P1, P2) which are adjacent to each other is generally made through the charge generating layer 620, and the charge transfer through the second stack 630 is insignificant.

Thus, according to one embodiment of the present disclosure, when the emission layer 600 is formed inside the trench (T), some of the emission layer 600 is disconnectedly provided. Especially, the first stack 610 and the charge generating layer 620 are provided disconnectedly so that it is possible to reduce the charge transfer between the neighboring sub pixels (P1, P2), to thereby prevent a leakage current.

A second electrode 700, which functions as a cathode, is formed on the emission layer 600. In the same manner as the emission layer 600, the second electrode 700 is formed in each of the sub pixels (P1, P2), and also formed in the boundary between the sub pixels (P1, P2). That is, the second electrode 700 can be formed above the bank 550.

An encapsulation layer 800 is formed on the second electrode 700, to thereby prevent external moisture from being permeated into the emission layer 600. The encapsulation layer 800 can be formed in a single-layered structure of an inorganic insulating material, or a deposition structure obtained by alternately depositing an inorganic insulating material and an organic insulating material, bet is not limited to these structures.

A color filter layer 900 is formed on the encapsulation layer 800. The color filter laser 900 confronts the emission area inside the individual sub pixel (P1, P2). The color filler layer 900 can include a red (R) color filter, a green (G) color filter, and a blue color filter, but is not limited to this structure. Meanwhile, although not shown, a black matrix can be additionally provided in the boundary between each of color filters in the color filter layer 900, to thereby prevent light from leaking into the remaining areas except the emission area.

Figure 6:
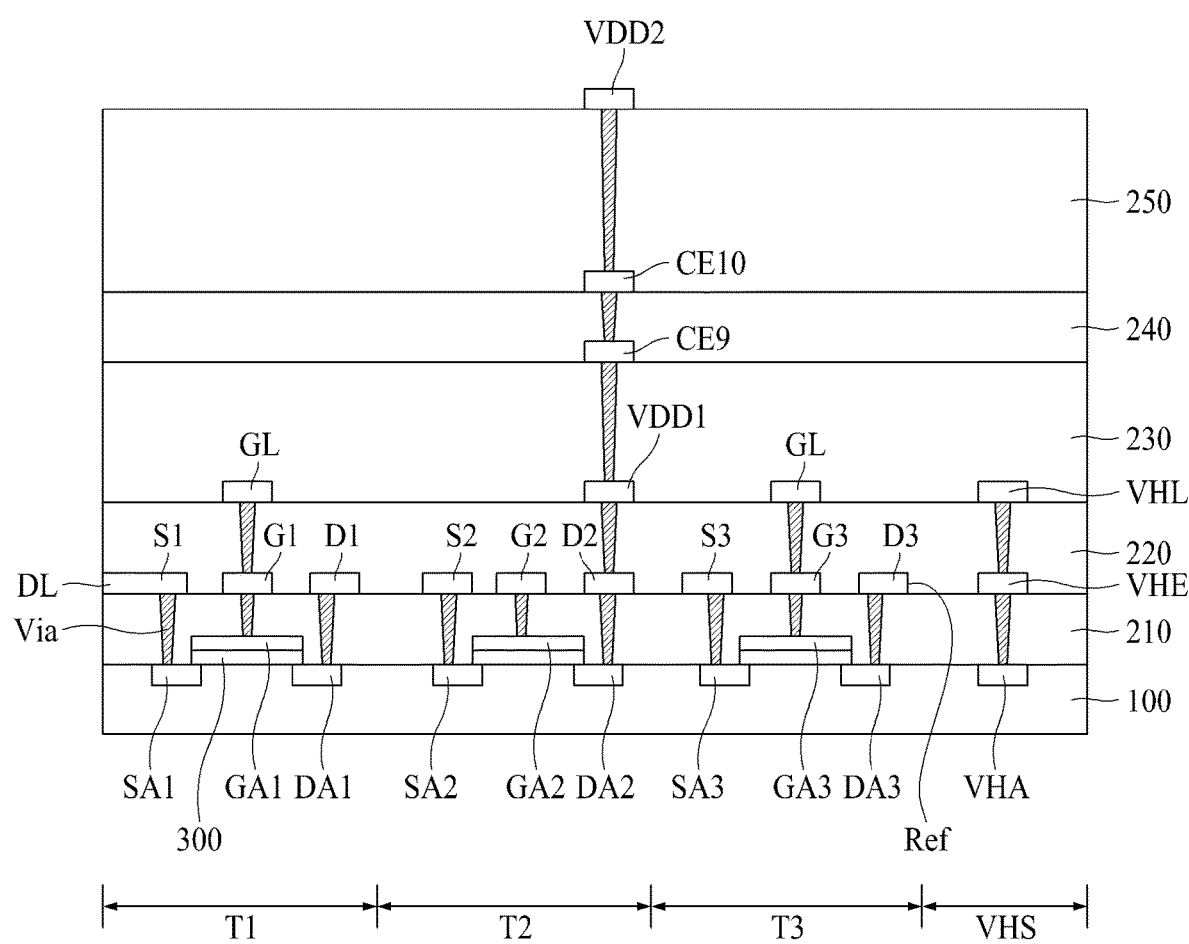
FIG. 6 is a cross sectional view illustrating the electroluminescent display device according to one embodiment of the present disclosure, which shows a deposition structure of a thin film transistor.

FIG. 6 is a cross sectional view illustrating the electroluminescent display device according to one embodiment of the present disclosure, which shows a deposition structure of the thin film transistor (T1, T2, T3), the gate line (GL), the data line (DL), the high power source line (VDD1, VDD2), the reference line (Ref), and the voltage holding line (VHL) shown in FIGS. 2 to 4. In FIG. 6, structures provided above the fifth insulating layer 250, for example, the anode electrode, the emission layer, and the cathode electrode are not shown, and the electrical connection structure between the anode electrode and the second source electrode (S2) of the driving thin film transistor (T2) described in FIG. 5 is also not shown.

As shown in FIG. 6, a switching thin film transistor (T1) area, a driving thin film transistor (T2) area, a initializing thin film transistor (T3) area, and a voltage holding structure (VHS) area are formed on the substrate 100.

The first source area (SA1) and the first drain area (DA1) are formed in the switching thin film transistor (T1) area of the substrate 100, the second source area (SA2) and the second drain area (DA2) are formed in the driving thin film transistor (T2) area of the substrate 100, the third source area (SA3) and the third drain area (DA3) are formed in the initializing thin film transistor (T3) area of the substrate 100, and the voltage holding area (VHA) is formed in the voltage holding structure (VHS) area of the substrate 100.

The substrate 100 is formed of a P-type semiconductor. Each of the first source area (SA1), the first drain area (DA1), the second source area (SA2), the second drain area (DA2), the third source area (SA3), and the third drain area (DA3) is formed of an N-type doping area obtained by doping a predetermined area of the substrate 100 with N-type dopant. The voltage holding area (VHA) can be formed of a $P^+$-type doping area obtained by doping a predetermined area of the substrate 100 with P-type dopant.

The gate insulating layer 300 and the first gate area (GA1), which are provided in the same pattern, are sequentially formed on the substrate 100 between the first source area (SA1) and the first drain area (DA1). The gate insulating layer 300 and the second gate area (GA2), which are provided in the same pattern, are sequentially formed on the substrate 100 between the second source area (SA2) and the second drain area (DA2). The gate insulating layer 300 and the third gate area (GA3), which are provided in the same pattern, are sequentially formed on the substrate 100 between the third source area (SA3) and the third drain area (DA3). The first gate area (GA1), the second gate area (GA2), and the third gate area (GA3) can be provided in the same layer, and can be formed of the same material.

The first insulating laser 210 is formed on the first gate area (GA1), the second gate area (GA2), and the third gate area (GA3).

The first source electrode (S1), the first gate electrode (G1), and the first drain electrode (D1) are formed in the switching thin film transistor (T1) area on the first insulating layer 210. The second source electrode (S2), the second gate electrode (G2), and the second drain electrode (D2) are formed in the driving thin film transistor (T2) area on the first insulating layer 210. The third source electrode (S3), the third gate electrode (G3), and the third drain electrode (D3) are formed in the initializing thin film transistor (T3) area on the first insulating layer 210. The voltage holding electrode (VHE) is formed in the voltage holding, structure (VHS) area on the first insulating laser 210.

The first source electrode (S1) is connected with the first source area (SA1) through the via penetrating through the first insulating layer 210, the first gate electrode (G1) is connected with the first gate area (GA1) through the via penetrating through the first insulating layer 210, and the first drain electrode (D1) is connected with the first drain area (DA1) through the via penetrating through the first insulating layer 210.

The second source electrode (S2) is connected with the second source area (SA2) through the via penetrating through the first insulating layer 210, the second gate electrode (G2) is connected with the second gate area (GA2) through the via penetrating through the first insulating layer 210, and the second drain electrode (D2) is connected with the second drain area (DA2) through the via penetrating through the first insulating layer 210.

The voltage holding electrode (VHE) is connected with the voltage holding area (VHA) through the via penetrating through the first insulating layer 210.

The first source electrode (S1), the first gate electrode (G1), the first drain electrode (D1), the second source electrode (S2), the second gate electrode (G2), the second drain electrode (D2), the third source electrode (S3), the third gate electrode (G3), the third drain electrode (D3), and the voltage holding electrode (VHE) can be provided in the same layer, and can be formed of the same material.

The first source electrode (S1) of the switching thin film transistor (T1) area is connected with the data line (DL), and more particularly, is formed as one body with the data line (DL). Thus, the data line (DL) is provided in the same layer as that of the first source electrode (S1), and is formed of the same material as that of the first source electrode (S1).

Also, the third drain electrode (D3) of the initializing thin film transistor (T3) area is connected with the reference line (Ref), and is formed as one body with the reference line (Ref). Thus, the reference line (Ref) is provided in the same layer as that of the third drain electrode (D3), and is formed of the same material as that of the third drain electrode (D3).

The second gate electrode (G2) is connected with the first drain electrode (D1), and the second source electrode (S2) is connected with the third source electrode (S3). Also, the first gate electrode (G1) can be connected with the third gate electrode (G3).

The second insulating layer 220 is formed on the first source electrode (S1), the first gate electrode (G1), the first drain electrode (D1), live second source electrode (S2), the second gate electrode (G2), the second drain electrode (D2), the third source electrode (S3), the third gate electrode (G3), the third drain electrode (D3), and the voltage holding electrode (VHE).

The gate line (GL), the first high power source line (VDD1), and the voltage holding line (VHL) are formed on the second insulating layer 220.

The gate line (GL) can be shared in the switching thin film transistor (T1) and the initializing thin film transistor (T3). Thus the gate line (GL) can be connected with each of the first gate electrode (G1) and the third gate electrode (G3) through the via penetrating through the second insulating layer 220.

The first high power source line (VDD1) is connected with the second drain electrode (D2) through the via penetrating through the second insulating layer 220, and the voltage holding line (VHL) is connected with the voltage holding electrode (VHE) through the via penetrating through the second insulating layer 220.

The gate line (GL), the first high power source line (VDD1), and the voltage holding line (VHL) are provided in the same layer, and are formed of the same material.

The third insulating layer 230 is formed on the gate line (GL), the first high power source line (VDD1), and the voltage holding line (VHL), and a ninth connection electrode (CE9) is formed on the third insulating layer 230. The ninth connection electrode (CE9) is connected with the first high power source line (VDD1) through the via penetrating through the thud insulating layer 230.

The fourth insulating layer 240 is formed on the ninth connection electrode (CE9), and a tenth connection electrode (CE10) is formed on the fourth insulating layer 240. The tenth connection electrode (CE10) is connected with the ninth connection electrode (CE9) through the via penetrating through the fourth insulating laser 240.

The fifth insulating layer 250 is formed on the tenth connection electrode (CE10), and the second high power source line (VDD2) is formed on the fifth insulating layer 250. The second high power source line (VDD2) is connected with the tenth connection electrode (CE10) through the via penetrating through the fifth insulating layer 250.

Thus, the second high power source line (VDD2) is connected with the first high power source line (VDD1) via the tenth connection electrode (CE10) and the ninth connection electrode (CE9). According to one embodiment of the present disclosure, the high power source line (VDD1, VDD2) includes the first high power source line (VDD1) and the second high power source line (VDD2) which are provided in the different layers and are electrically connected with each other, whereby it is possible to stably supply the high power source to the second drain electrode (D2) of the driving thin film transistor (T2).

The first high power source line (VDD1) and the second high power source line (VDD2) are provided in a continuous straight-line shape along a horizontal direction, but are not limited to this structure. The second high power source line (VDD2) can be provided in a continuous straight-line shape along a horizontal direction, and the first high power source line (VDD1) can be provided in a discontinuous straight-line shape along the horizontal direction.

Figure 7A:
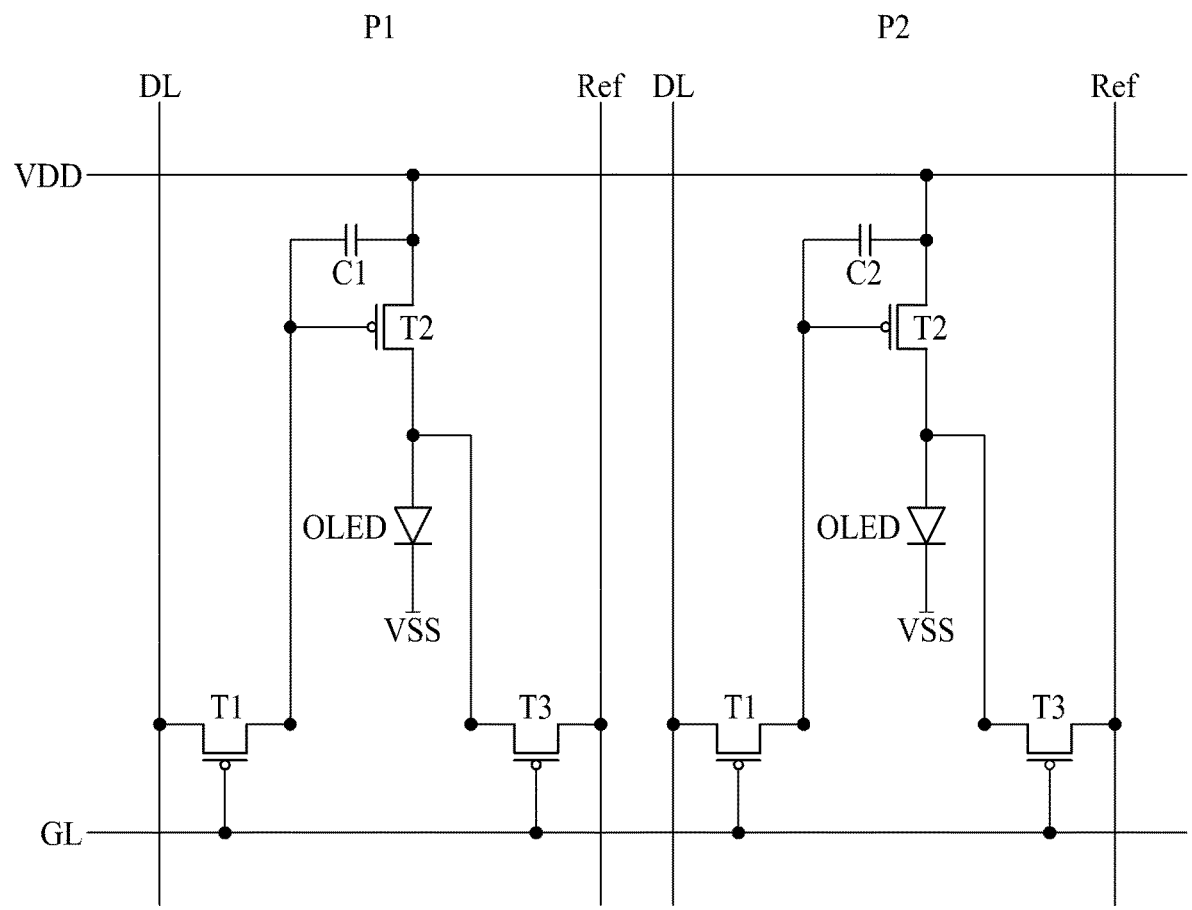
FIG. 7A is a circuit diagram of an individual sub pixel of an electroluminescent display device according to another embodiment of the present disclosure.
Figure 7B:
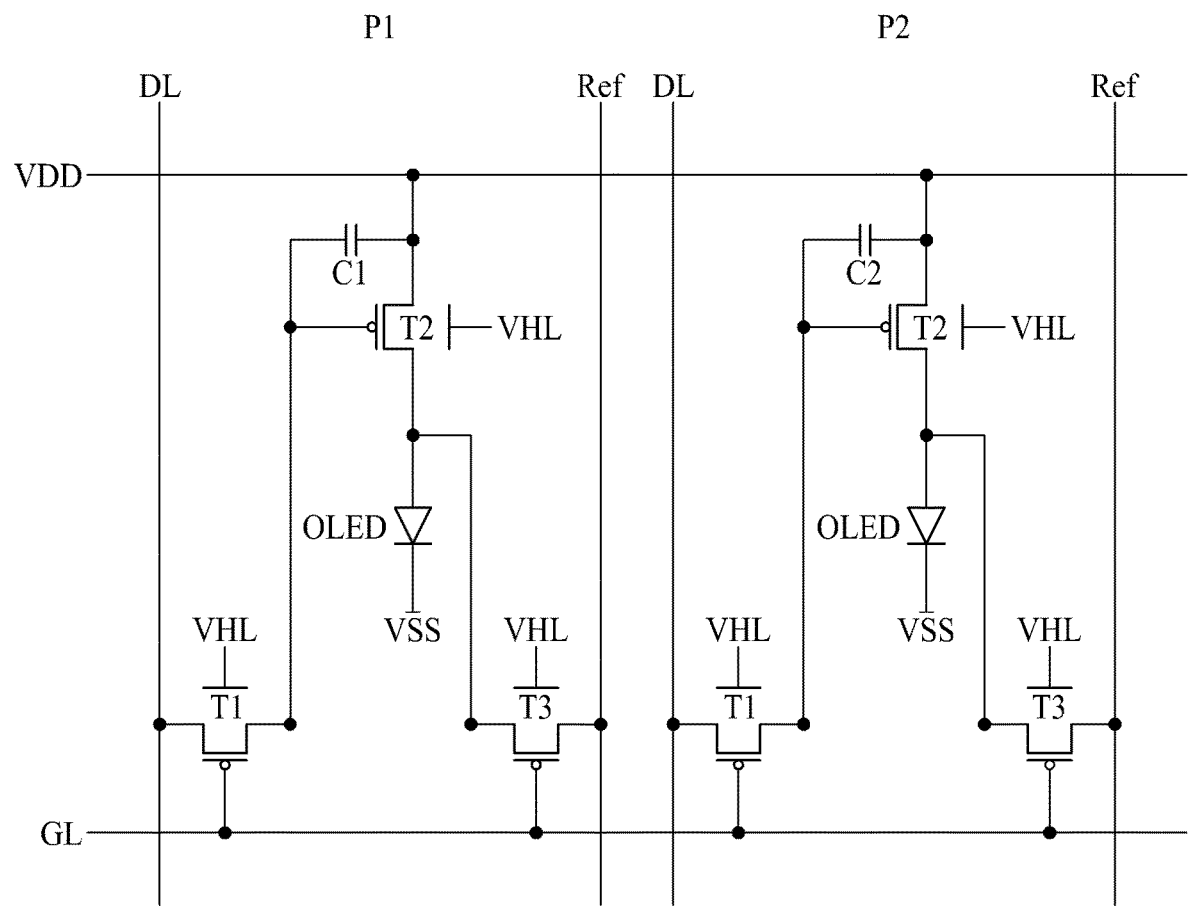
FIG. 7B is a circuit diagram of an individual sub pixel of an electroluminescent display device according to another embodiment of the present disclosure.

FIG. 7A is a circuit diagram of an individual sub pixel (P1, P2) of an electroluminescent display device according to another embodiment of the present disclosure, and FIG. 7B is a circuit diagram of an individual sub pixel of an electroluminescent display device according to another embodiment of the present disclosure.

Except a thin film transistor (T1, T2, T3) and a capacitor (C1, C2) in each of a first sub pixel (P1) and a second sub pixel (P2), the electroluminescent display device of FIG. 7A is identical to the electroluminescent display device of FIG. 1A, whereby the different structures will be described in detail.

In case of the aforementioned FIG. 1A, the switching thin film transistor (T1), the driving thin film transistor (T2), and the initializing thin film transistor (T3) are formed of NMOS transistors.

Meanwhile in case of FIG. 7A, a switching thin film transistor (T1), a driving thin film transistor (T2), and a initializing thin film transistor (T3) are formed of PMOS transistors.

Also, in case of the aforementioned FIG. 1A, each of the first capacitor (C1) provided in the first sub pixel (P1) and the second capacitor (C2) provided in the second sub pixel (P2) is connected with the gate and source terminals of the driving thin film transistor (T2), wherein the gate terminal of the driving thin film transistor (T2) is connected with the drain terminal of the switching thin film transistor (T1), and the source terminal of the driving thin film transistor (T2) is connected with the anode terminal of the light emitting device (OLED).

Meanwhile, in case of FIG. 7A, each of a first capacitor (C1) provided in a first sub pixel (P1) and a second capacitor (C2) provided in a second sub pixel (P2) is connected with, gate and source terminals of the driving thin film transistor (T2), wherein the gate terminal of the driving thin film transistor (T2) is connected with a drain terminal of the switching thin film transistor (T1), and the source terminal of the driving thin film transistor (T2) is connected with a high power source line (VDD).

FIG. 7B shows that a voltage holding line (VHL) is additionally provided. If the electroluminescent display device according to the present disclosure uses a semiconductor substrate such as silicon wafer, the voltage holding line (VHL) supplies a voltage for constantly maintaining a voltage of the semiconductor substrate. Thus, the circuit diagram of FIG. 7B is not applied to a case of using a glass substrate or a plastic substrate.

Figure 8:
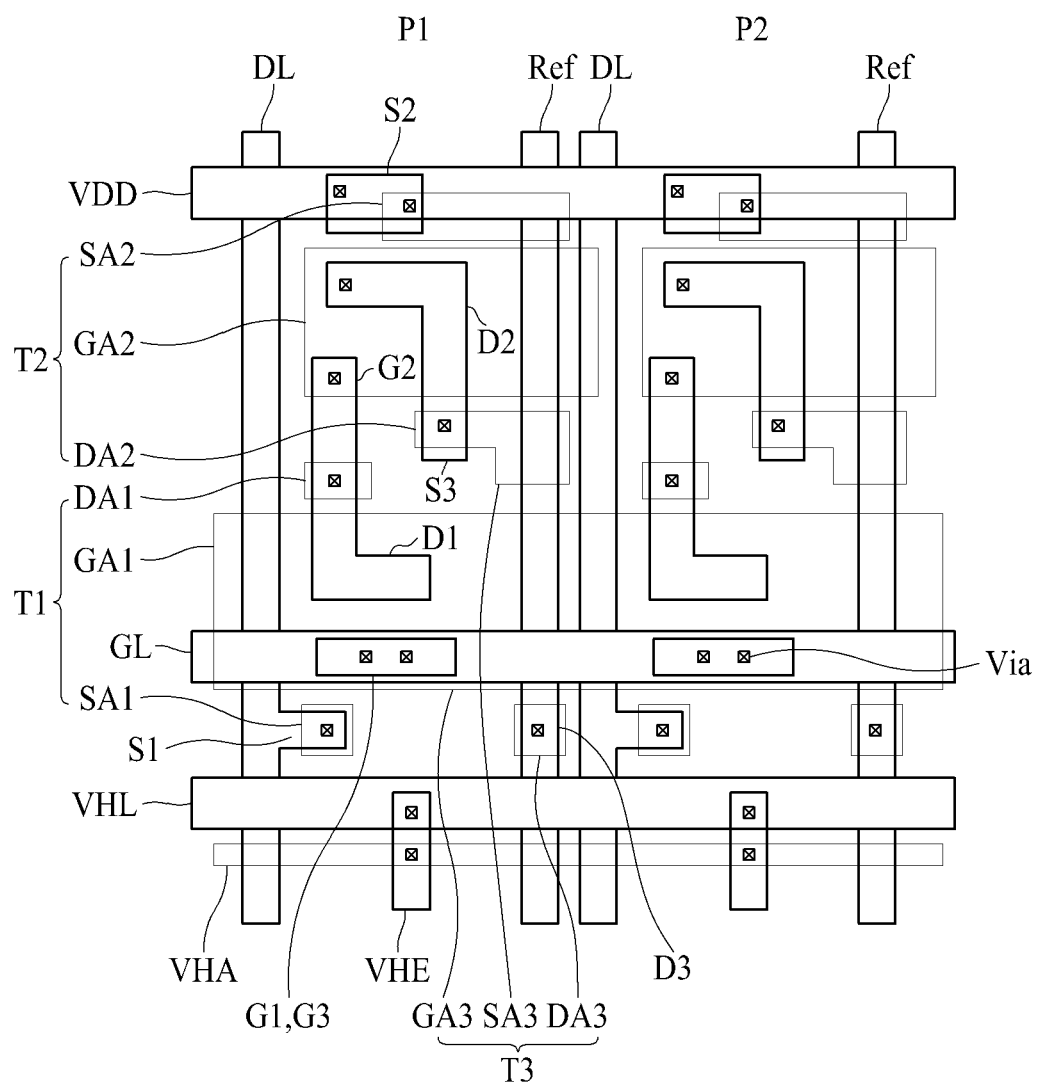
Figure 9:
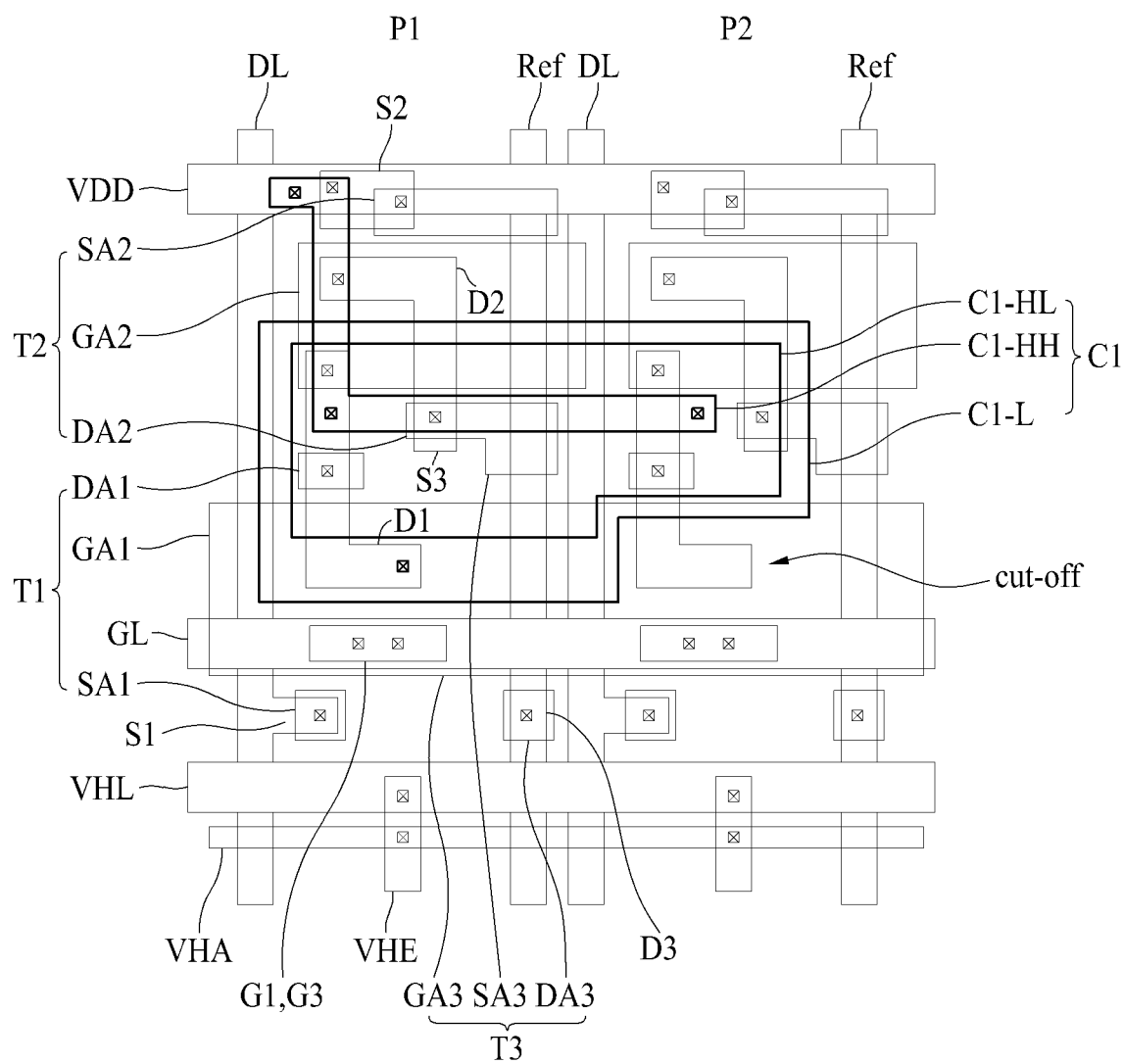
Figure 10:
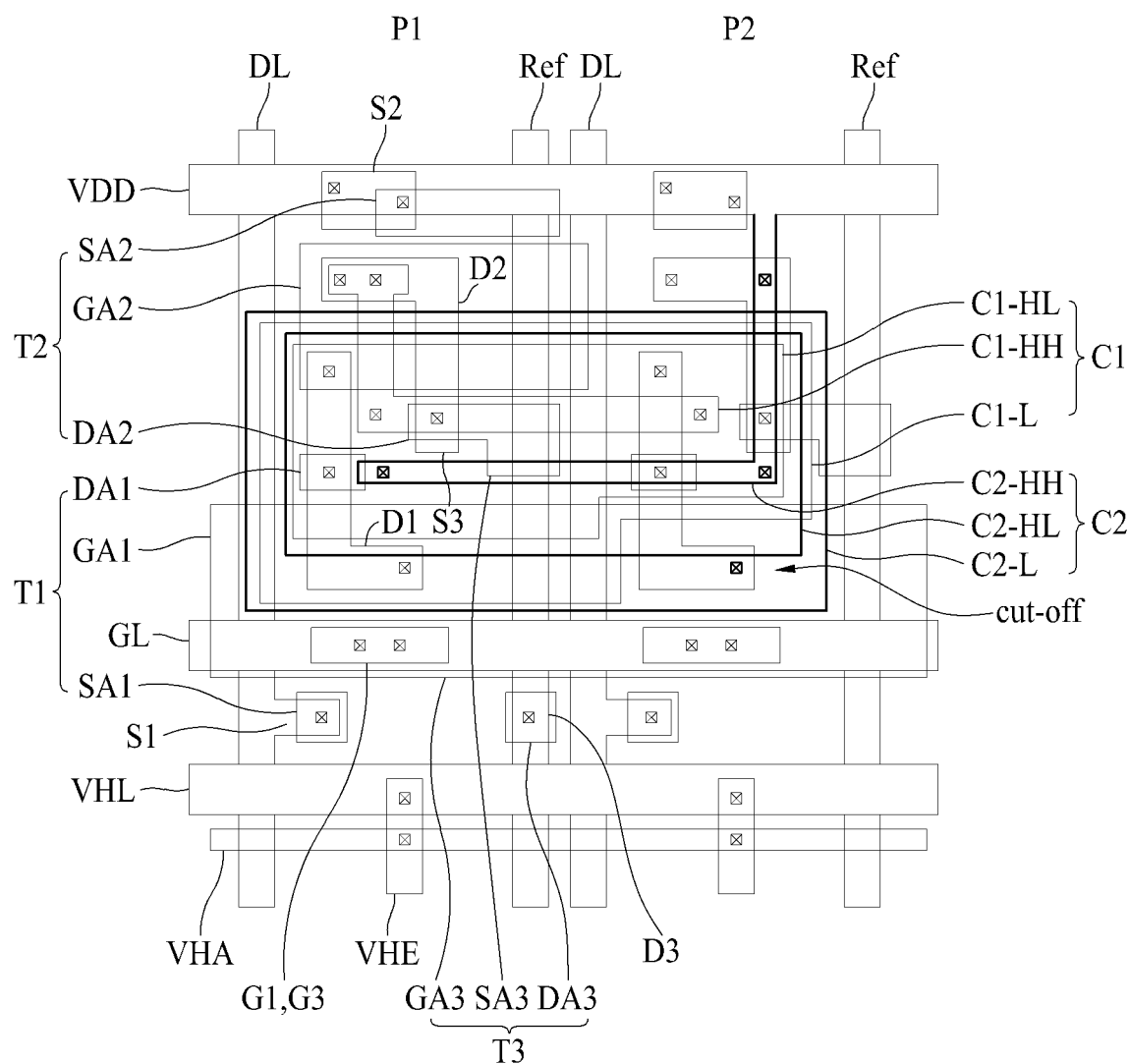

FIGS. 8 to 10 are plane views illustrating the electroluminescent display device according to another embodiment of the present disclosure. FIG. 8 illustrates remaining structures except the capacitor (C1, C2) in the circuit diagram of FIG. 7B, FIG. 9 illustrates a structure obtained by additionally providing the first capacitor (C1) to FIG. 8, and FIG. 10 illustrates a structure obtained by additionally providing the second capacitor (C2) to FIG. 9.

Except a switched structure of source/drain in the driving thin film transistor (T2) of the electroluminescent display device shown in FIG. 8, the electroluminescent display device of FIG. 8 is or can be identical in structure to the electroluminescent display device of FIG. 2. Hereinafter, the different structures will be described in detail.

As shown in FIG. 8, the driving thin film transistor (T2) of the individual sub pixel (P1, P2) includes a second gate area (GA2), a second source area (SA2), and a second drain area (DA2).

The second source area (SA2) is connected with a second source electrode (S2) through the via (x), and the second source electrode (S2) is connected with the high power source line (VDD) through the via (x). The second source area (SA2) can be patterned in the individual sub pixel (P1, P2) while being overlapped with the second source electrode (S2), and the second source electrode (S2) can be patterned in the individual sub pixel (P1, P2) while being overlapped with the high power source line (VDD).

The second drain area (DA2) is connected with a second drain electrode (D2) through the via (x), and the second drain electrode (D2) is connected with an anode electrode through the via (x). The second drain area (DA2) and the second drain electrode (D2) can be patterned in the individual sub pixel (P1, P2) while being overlapped with each other.

The second drain area (DA2) is connected with a second source area (SA2) of the initializing thin film transistor (T3), and the second drain electrode (D2) is connected with a second source electrode (S2) of the initializing thin film transistor (T3). The second drain area (DA2) is formed as one body with the second source area (SA2), and the second drain electrode (D2) is formed as one body with the second source electrode (S2).

As shown in FIG. 9, the first capacitor (C1) is provided in the first sub pixel (P1).

The first capacitor (C1) includes a first capacitor lower electrode (C1-L) and a first capacitor upper electrode (C1-HL, C1-HH).

The first capacitor lower electrode (C1-L) is connected with a second gate electrode (G2) of the first sub pixel (P1) through the via (x). Especially, the first capacitor lower electrode (C1-L), which extends from the first sub pixel (P1) to the second sub pixel (P2), is overlapped with the first sub pixel (P1) and the second sub pixel (P2), and a cut-off area is provided in the second sub pixel (P2).

The first capacitor upper electrode (C1-HL, C1-HH) includes a first lower layer (C1-HL) and a first upper layer (C1-HH).

The first lower layer (C1-HL) is connected with the first upper layer (C1-HH) through the via (x) provided in the first sub pixel (P1) and the second sub pixel (P2), and the first upper layer (C1-HH) is connected with the high power source line (VDD) through the via (x) provided in the first sub pixel (P1). Thus, the first lower layer (C1-HL) is connected with the high power source line (VDD) through the first upper layer (C1-HH).

The first lower layer (C1-HL) and the first upper layer (C1-HH) are extending from the first sub pixel (P1) to the second sub pixel (P2), and are overlapped with the first sub pixel (P1) and the second sub pixel (P2). However, the first upper layer (C1-HH) can be not extending to the second sub pixel (P2).

An area of the first lower layer (C1-HL) is relatively larger than an area of the first upper layer (C1-HH) so that it is possible to increase a capacitance of the first capacitor (C1). Meanwhile, the area of the first lower layer (C1-HL) is relatively smaller than an area of the first capacitor lower electrode (C1-L), but is not limited to this structure.

As shown in FIG. 10, the second capacitor (C2) is provided in the second sub pixel (P2). The second capacitor (C2) is overlapped with the first capacitor (C1).

The second capacitor (C2) includes a second capacitor lower electrode (C2-L) and a second capacitor upper electrode (C2-HL, C2-HH).

The second capacitor lower electrode (C2-L) is connected with the second gate electrode (G2) of the second sub pixel (P2) through the via (x) in the cut-off area of the first capacitor lower electrode (C1-L). The second capacitor lower electrode (C2-L), which extends from the second sub pixel (P2) to the first sub pixel (P1), is overlapped with the first sub pixel (P1) and the second sub pixel (P2). Unlike the first capacitor lower electrode (C1-L), the second capacitor lower electrode (C2-L) is not provided with the additional cut-off area. Thus, an area of the second capacitor lower electrode (C2-L) is larger than an area of the first capacitor lower electrode (C1-L). The second capacitor lower electrode (C2-L) can be overlapped with the first capacitor lower electrode (C1-L) and the first capacitor upper electrode (C1-HL, C1-HH) constituting the first capacitor (C1).

The second capacitor upper electrode (C2-HL, C2-HH) includes a second lower layer (C2-HL) and a second upper layer (C2-HH). The second lower layer (C2-HL) can be connected with the second upper layer (C2-HH) through the via provided in the first sub pixel (P1) and the second sub pixel (P2), and the second upper layer (C2-HH) can be connected with the high power source line (VDD). Thus, the second lower layer (C2-HL) is connected with the high power source line (VDD) through the second upper layer (C2-HH).

The second upper layer (C2-HH) can be diverged from the high power source line (VDD), whereby the second upper layer (C2-HH) can be formed as one body with the high power source line (VDD).

The second lower layer (C2-HL) and the second upper layer (C2-HH), which extend from the second sub pixel (P2) to the first sub pixel (P1), are overlapped with the first sub pixel (P1) and the second sub pixel (P2). However, the second upper layer (C2-HH) can be not extending to the first sub pixel (P1). An area of the second lower layer (C2-HL) is relatively larger than an area of the second upper layer (C2-HH) so that it is possible to increase a capacitance of the second capacitor (C2). Meanwhile, the area of the second lower layer (C2-HL) can be relatively smaller than an area of the second capacitor lower electrode (C2-L), but is not limited to this structure.

The second lower layer (C2-HL) can be overlapped with the first capacitor lower electrode (C1-L) and the first capacitor upper electrode (C1-HL, C1-HH) constituting the first capacitor (C1). The second upper layer (C2-HH) is overlapped with the first lower layer (C1-HL) and the first capacitor lower electrode (C1-L) of the first capacitor (C1), but not overlapped with the first upper layer (C1-HH). However, the second upper layer (C2-HH) can be overlapped with the first upper layer (C1-HH).

Figure 11:
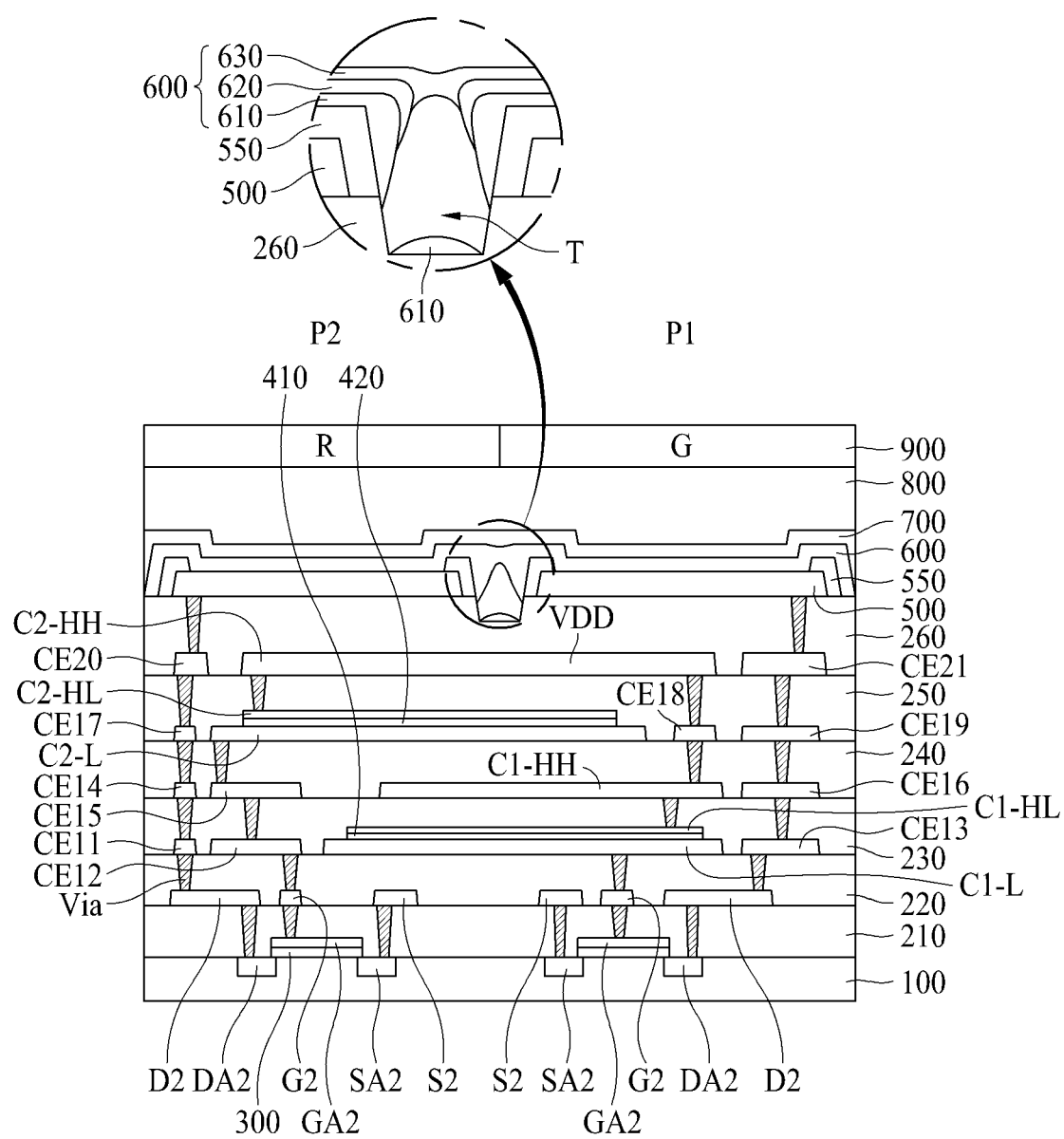
FIG. 11 is a cross sectional view illustrating a first sub pixel and a second sub pixel of the electroluminescent display device according to another embodiment of the present disclosure.

FIG. 11 is a cross sectional view illustrating the first sub pixel (P1) and the second sub pixel (P2) of the electroluminescent display device according to another embodiment of the present disclosure, which shows an electrical connection between the driving thin film transistor (T2) and the capacitor electrode (C1, C2) shown in FIGS. 8 to 10. A detailed description for the same parts as those of FIG. 5 will be omitted.

As shown in FIG. 11, the second source area (SA2) and the second drain area (DA2) are provided in the substrate 100.

Between the second source area (SA2) and the second drain area (DA2), a gate insulating layer 300 is formed on the substrate 100, and the second gate area (GA2) is formed on the gate insulating layer 300.

A first insulating layer 210 is formed on the second gate area (GA2), and the second source electrode (S2), the second gate electrode (G2), and the second drain electrode (D2) are formed on the first insulating layer 210.

The second source electrode (S2) is connected with the second source area (SA2) through the via penetrating through the first insulating layer 210, the second gate electrode (G2) is connected with the second gate area (GA2) through the via penetrating through the first insulating layer 210, and the second drain electrode (D2) is connected with the second drain area (DA2) through the via penetrating through the first insulating layer 210.

A second insulating layer 220 is formed on the second source electrode (S2), the second gate electrode (G2), and the second drain electrode (D2). Then, an eleventh connection electrode (CE11), a twelfth connection electrode (CE12), a thirteenth connection electrode (CE13), and the first capacitor lower electrode (C1-L) are termed on the second insulating layer 220. The eleventh connection electrode (CE11) and the twelfth connection electrode (CE12) are formed in the second sub pixel (P2), the thirteenth connection electrode (CE13) is formed in the first sub pixel (P1), and the first capacitor lower electrode (C1-L) extends from the first sub pixel (P1) to the second sub pixel (P2).

The eleventh connection electrode (CE11) is connected with the second source electrode (S2) of the second sub pixel (P2) through the via penetrating through the second insulating layer 220, and the twelfth connection electrode (CE12) is connected with the second gate electrode (G2) of the second sub pixel (P2) through the via penetrating through the second insulating layer 220. The thirteenth connection electrode (CE13) is connected with the second drain electrode (D2) of the first sub pixel (P1) through the via penetrating through the second insulating layer 220, and the first capacitor lower electrode (C1-L) is connected with the second gate electrode (G2) of the first sub pixel (P1) through the via penetrating through the second insulating layer 220.

A first insulating interlayer 410 is formed on the first capacitor lower electrode (C1-L), and the lower layer (C1-HL) of the first capacitor upper electrode (C1-HL, C1-HH) is formed on the first insulating interlayer 410. The first insulating interlayer 410 and the lower layer (C1-HL) of the first capacitor upper electrode (C1-HL, C1-HH) extend front the first sub pixel (P1) to the second sub pixel (P2).

A third insulating layer 230 is formed on the lower layer (C1-HL) of the first capacitor upper electrode (C1-HL, C1-HH). Then, a fourteenth connection electrode (CE14), a fifteenth connection electrode (CE15), a sixteenth connection electrode (CE16), and the upper layer (C1-HH) of the first capacitor upper electrode (C1-HL, C1-HH) are formed on the third insulating layer 230. The fourteenth connection electrode (CE14) and the fifteenth connection electrode (CE15) are formed in the second sub pixel (P2), the sixteenth connection electrode (CE16) is formed in the first sub pixel (P1), and the upper layer (C1-HH) of the first capacitor upper electrode (C1-HL, C1-HH) extends iron the first sub pixel (P1) to the second sub pixel (P2).

The fourteenth connection electrode (CE14) is connected with the eleventh connection electrode (CE11) of the second sub pixel (P2) through the via penetrating through the third insulating layer 230, and the fifteenth connection electrode (CE15) is connected with the twelfth connection electrode (CE12) of the second sub pixel (P2) through the via penetrating through the third insulating layer 230. The sixteenth connection electrode (CE16) is connected with the thirteenth connection electrode (CE13) of the first sub pixel (P1) through the via penetrating through the third insulating layer 230. The upper layer (C1-HH) of the first capacitor upper electrode (C1-HL, C1-HH) is connected with the lower layer (C1-HL) of the first capacitor upper electrode (C1-HL, C1-HH) through the via penetrating through the third insulating layer 230.

A fourth insulating layer 240 is formed on the fourteenth connection electrode (CE14), the fifteenth connection electrode (CE15), the sixteenth connection electrode (CE16), and the upper layer (C1-HH). Then, a seventeenth connection electrode (CE17), an eighteenth connection electrode (CE18), a nineteenth connection electrode (CE19), and the second capacitor lower electrode (C2-L) are formed on the fourth insulating layer 240. The seventeenth connection electrode (CE17) is formed in the second sub pixel (P2), the eighteenth connection electrode (CE18) and the nineteenth connection electrode (CE19) are formed in the first sub pixel (P1), and the second capacitor lower electrode (C2-L) extends from the second sub pixel (P2) to the first sub pixel (P1).

The seventeenth connection electrode (CE17) is connected with the fourteenth connection electrode (CE14) through the via penetrating through the fourth insulating layer 240, and the eighteenth connection electrode (CE18) is connected with the upper layer (C1-HH) of the first capacitor upper electrode (C1-HL, C1-HH) through the via penetrating through the fourth insulating layer 240. The nineteenth connection electrode (CE19) is connected with the sixteenth connection electrode (CE16) through the via penetrating through the fourth insulating layer 240, and the second capacitor lower electrode (C2-L) is connected with the fifteenth connection electrode (CE15) through the via penetrating through the fourth insulating layer 240. Thus, the second capacitor lower electrode (C2-L) is connected with the second gate electrode (G2) of the second sub pixel (P2) via the fifteenth connection electrode (CE15) and the twelfth connection electrode (CE12).

A second insulating interlayer 420 is formed on the second capacitor lower electrode (C2-L), and the lower layer (C2-HL) of the second capacitor upper electrode (C2-HL, C2-HH) is formed on the second insulating interlayer 420. The second insulating interlayer 420 and the lower layer (C2-HL) of the second capacitor upper electrode (C2-HL, C2-HH) extend from the second sub pixel (P2) to the fast sub pixel (P1).

A fifth insulating layer 250 is formed on the lower layer (C2-HL) of the second capacitor upper electrode (C2-HL, C2-HH). Then, a twentieth connection electrode (CE20), a twenty-first connection electrode (CE21), and the upper layer (C2-HH) of the second capacitor upper electrode (C2-HL, C2-HH) are formed on the fifth insulating layer 250. The twentieth connection electrode (CE20) is formed in the second sub pixel (P2), the twenty-first connection electrode (CE21) is formed in the first sub pixel (P1), and the upper layer (C2-HH) of the second capacitor upper electrode (C2-HL, C2-HH) extend from the second sub pixel (P2) to the first sub pixel (P1).

The twentieth connection electrode (CE20) is connected with the seventeenth connection electrode (CE17) through the via penetrating through the filth insulating layer 250, and the twenty-first connection electrode (CE21) is connected with the nineteenth connection electrode (CE19) through the via penetrating through the fifth insulating layer 250. The upper layer (C2-HH) of the second capacitor upper electrode (C2-HL, C2-HH) is connected with the lower layer (C2-HL) of the second capacitor upper electrode (C2-HL, C2-HH) through the via penetrating through the fifth insulating layer 250.

The upper layer (C2-HH) of the second capacitor upper electrode (C2-HL, C2-HH) is connected with the high power source line (VDD), and the upper layer (C2-HH) of the second capacitor upper electrode (C2-HL, C2-HH) is formed as one body with the high power source line (VDD). Also, the high power source line (VDD) is connected with the eighteenth connection electrode (CE18) through the via penetrating through the fifth insulating layer 250. Thus, the high power source line (VDD) is connected with the upper layer (C1-HH) of the first capacitor upper electrode (C1-HL, C1-HH) through the eighteenth connection electrode (CE18).

A sixth insulating layer 260 is formed on the twentieth connection electrode (CE20), the twenty-first connection electrode (CE21), the upper layer (C2-HH) of the second capacitor upper electrode (C2-HL, C2-HH), and the high power source line (VDD). The first electrode 500, which functions as an anode, is formed in each of the first sub pixel (P1) and the second sub pixel (P2) on the sixth insulating layer 260.

The first electrode 500 of the first sub pixel (P1) is connected with the twenty-first connection electrode (CE21) through the via penetrating through the sixth insulating layer 260. Thus, the first electrode 500 of the first sub pixel (P1) is connected with the second drain electrode (D2) of the first sub pixel (P1) via the twenty-first connection electrode (CE21), the nineteenth connection electrode (CE19), the sixteenth connection electrode (CE16), and the thirteenth connection electrode (CE13).

The first electrode 500 of the second sub pixel (P2) is connected with the twentieth connection electrode (CE20) through the via penetrating through the sixth insulating layer 260. Thus, the first electrode 500 of the second sub pixel (P2) is connected with the second drain electrode (D2) of the second sub pixel (P2) via the twentieth connection electrode (CE20), the seventeenth connection electrode (CE17), the fourteenth connection electrode (CE14), and the eleventh connection electrode (CE11).

A bank 550 is provided on the sixth insulating layer 260, and is configured to cover both ends of the first electrode 500, an emission layer 600 is formed on the first electrode 500, a second electrode 700 is formed on the emission layer 600, an encapsulation layer 800 is formed on the second electrode 700, and a color filter layer 900 is formed on the encapsulation layer 800.

Figure 12A:
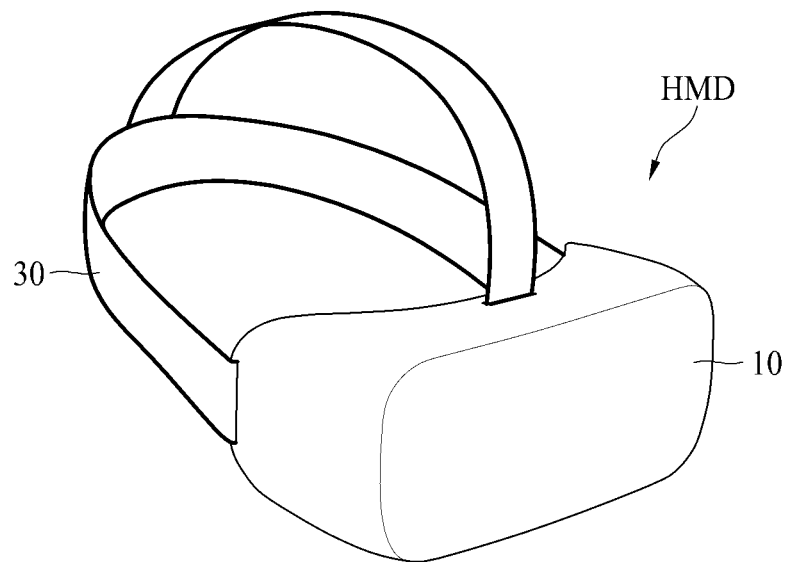
FIGS. 12A to 12C illustrate an electroluminescent display device according to another embodiment of the present disclosure, which relate to a head mounted display (HMD) device.
Figure 12B:
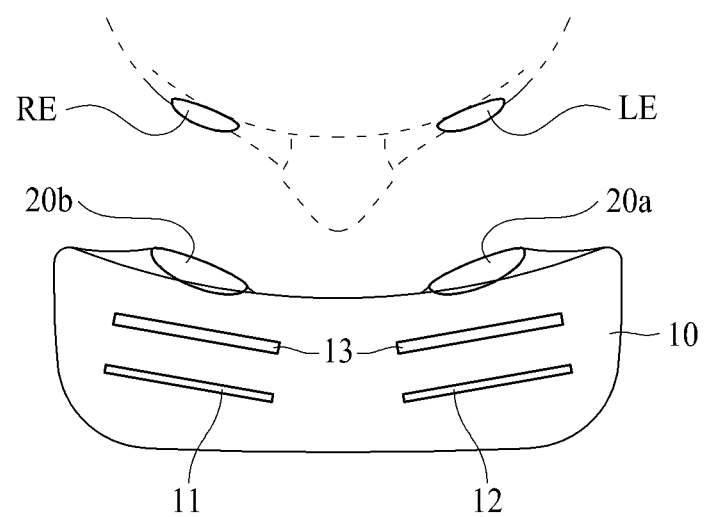
Figure 12C:
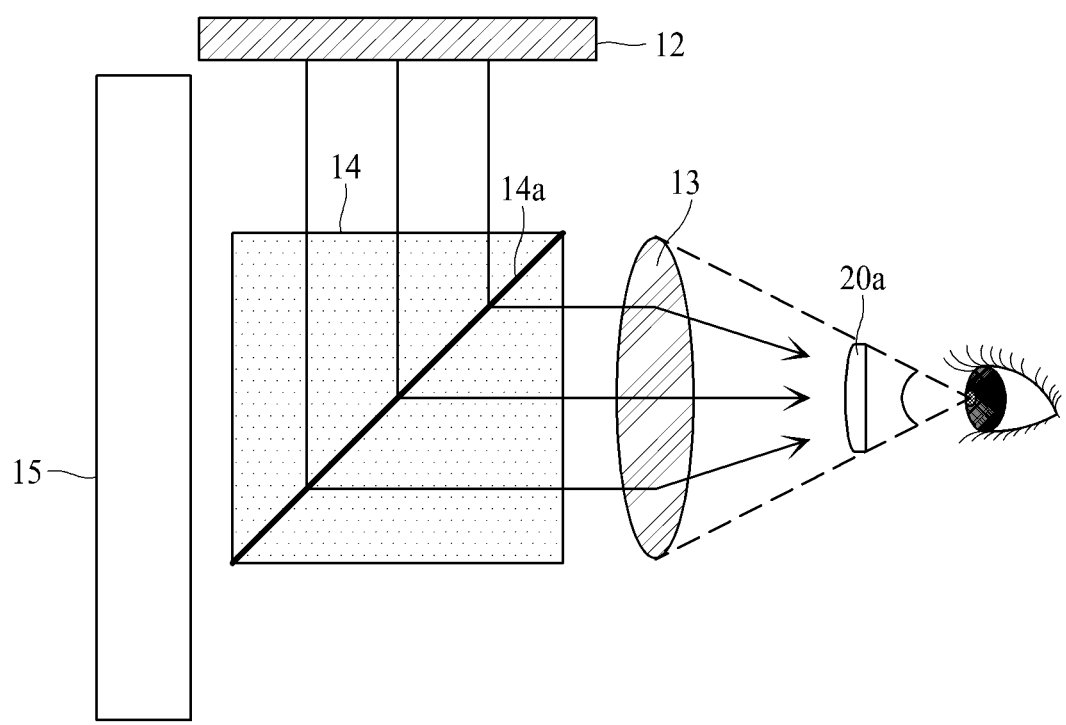

FIGS. 12A to 12C illustrate an electroluminescent display device according to another embodiment of the present disclosure, which relate with a head mounted display (HMD) device. FIG. 12A is a schematic perspective view. FIG. 12B is a schematic plane view of a virtual reality (VR) structure, and FIG. 12C is a schematic cross sectional view of an augmented reality (AR) structure. All the components of the HMD device and the VR structure are operatively coupled and configured.

As shown in FIG. 12A, the heal mounted display (HMD) device according to the present disclosure includes a receiving case 10 and a head mounted band 30.

A display device, a lens array and an ocular eyepiece can be received or housed inside of the receiving case 10.

The head mounted band 30 is fixed to the receiving case 10. In the drawings, the head mounted band 30 is configured to surround an upper surface and both lateral surfaces in a user's head, but the features are not limited to this structure. For example, the head mounted band is provided to fix the head mounted display (HMD) device to a user's head, which can be substituted by an eyeglass-frame shape or a helmet-shaped structure.

As shown in FIG. 12B, the head mounted display (HMD) device of the virtual reality (VR) structure according to the present disclosure includes a left-eye display device 12, a right-eye display device 11, a lens array 13, a left-eye ocular eyepiece 20a and a right eye ocular eyepiece 20b.

The left-eye display device 12, the right-eye display device 11, the lens array 13, and the left-eye ocular eyepiece 20a and the right-eye ocular eyepiece 20b are received in the aforementioned receiving case 10.

The same image can be displayed on the left-eye display device 12 and the right-eye display device 11. In this case, a user can watch a two-dimensional (2D) image. If an image for the left eye is displayed on the left-eye display device 12, and an image for the right eye is displayed on the right-eye display device 11, the user can watch a three-dimensional (3D) image. Each of the left-eye display device 12 and the right-eye display device 11 can be formed of the aforementioned display device shown in FIGS. 1 to 11. In this case, an upper portion corresponding to a surface for displaying an image in FIGS. 1 to 11, for example, the color filter layer 900 confronts the lens array 13.

The lens array 13 can be disposed between the left-eye ocular eyepiece 20a and the left-eye display device 12 while being apart from each of the left-eye ocular eyepiece 20a and the left-eye display device 12. For example, the lens array 13 can be positioned at the front of the left-eye ocular eyepiece 20a and at the rear of the left-eye display device 12. Also, the lens array 13 can be disposed between the right-eye ocular eyepiece 20b and the right-eye display device 11 while being apart from each of the right-eye ocular eyepiece 20b and the right-eye display device 11. That is, the lens array 13 can be positioned at the front of the right-eye ocular eyepiece 20b and at the rear of the right-eye display device 11.

The lens array 13 can be a micro lens array. The lens array 13 can be substituted by a pin hole array. Owing to the lens array 13, an image displayed on the left-eye display device 12 or the right-eye display device 11 can be expanded and perceived by a user.

A user's left eye (LE) can be positioned at the left-eye ocular eyepiece 20a, and the user's right eye (RE) can be positioned at the right-eye ocular eyepiece 20b.

As shown in FIG. 12C, the head mounted display (HMD) device of the augmented reality (AR) structure according to the present disclosure includes a left-eye display device 12, a lens array 13, a left-eye ocular eyepiece 20a, a transmissive reflecting portion 14 and a transmission window 15. FIG. 12C shows only the left-eye structure, for convenience of explanation. The right-eye structure can be identical in structure to the left-eye structure.

The left-eye display device 12, the lens array 13, the left-eye ocular eyepiece 20a, the transmissive reflecting portion 14 and the transmission window 15 are received in the aforementioned receiving case 10.

The left-eye display device 12 can be disposed at one side of the transmissive reflecting portion 14, for example, an upper side of the transmissive reflecting portion 14 without covering the transmission window 15. Accordingly, an image can be provided to the transmissive reflecting portion 14 under the condition that an ambient background seen through the transmission window 15 is not covered by the left-eye display device 12.

The left-eye display device 12 can be formed of the display device shown in FIGS. 1 to 11. In this case, an upper portion corresponding to a surface for displaying an image in FIGS. 1 to 11, for example, the color filter layer 900 confronts the transmissive reflecting portion 14.

The lens array 13 can be provided between the left-eye ocular eyepiece 20a and the transmissive reflecting portion 14.

The user's left eye is positioned at the left-eye ocular eyepiece 20a.

The transmissive reflecting portion 14 is disposed between the lens array 13 and the transmission window 15. The transmissive reflecting portion 14 can include a reflection surface 14a which partially transmits some of light, and also reflects the remaining light. The reflection surface 14a is configured to guide an image, which is displayed on the left-eye display device 12, toward the lens array 13. Thus, the user can watch an image displayed on the left-eye display device 12 together with the ambient background through the transmission window 15. For example, the user can watch one image obtained by a virtual image overlaid with the ambient real background, to thereby realize an augmented reality (AR).

The transmission window 15 is disposed in front of the transmissive reflecting portion 14.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display device comprising:
 a substrate including a first sub pixel and a second sub pixel which are adjacent to each other;
 a driving thin film transistor provided in each of the first sub pixel and the second sub pixel, and configured to include a gate electrode, a source electrode, and a drain electrode;
 a first capacitor electrically connected with gate and source electrodes of the driving thin film transistor provided in the first sub pixel; and
 a second capacitor electrically connected with gate and source electrodes of the driving thin film transistor provided in the second sub pixel,
 wherein the first capacitor includes a first capacitor lower electrode, a first capacitor upper electrode, and a first insulating layer between the first capacitor lower electrode and the first capacitor upper electrode,
 wherein the second capacitor includes a second capacitor lower electrode, a second capacitor upper electrode, and a second insulating layer between the second capacitor lower electrode and the second capacitor upper electrode, and
 wherein the first capacitor lower electrode and the first capacitor upper electrode extend from the first sub pixel to the second subpixel, and the second capacitor lower electrode and the second capacitor upper electrode extend from the second sub pixel to the first sub pixel.

2. The electroluminescent display device according to claim 1,
 wherein the first capacitor lower electrode is electrically connected with any one of the gate and source electrodes of the driving thin film transistor provided in the first sub pixel, and the first capacitor upper electrode is electrically connected with the other one of the gate and source electrodes of the driving thin film transistor provided in the first sub pixel, and
 wherein the first insulating layer is provided in a different layer from the second insulating layer.

3. The electroluminescent display device according to claim 2, wherein the first capacitor upper electrode includes a first lower layer and a first upper layer which are electrically connected with each other.

4. The electroluminescent display device according to claim 3, wherein an area of the first lower layer is larger than an area of the first upper layer.

5. The electroluminescent display device according to claim 3, wherein a distance between the first lower layer and the first capacitor lower electrode is shorter than a distance between the first lower layer and the first upper layer.

6. The electroluminescent display device according to claim 2, wherein the source electrode of the driving thin film transistor provided in the first sub pixel is electrically connected with an anode electrode provided in the first sub pixel.

7. The electroluminescent display device according to claim 6, wherein the first capacitor upper electrode is connected with the anode electrode via two connection electrodes provided in different layers.

8. The electroluminescent display device according to claim 2, wherein the source electrode of the driving thin film transistor provided in the first sub pixel is electrically connected with a power source line arranged in a first direction.

9. The electroluminescent display device according to claim 8, wherein the first capacitor upper electrode is connected with the power source line via one connection electrode.

10. The electroluminescent display device according to claim 2,
 wherein the second capacitor lower electrode is electrically connected with any one of the gate and source electrodes of the driving thin film transistor provided in the second sub pixel, and the second capacitor upper electrode is electrically connected with the other one of the gate and source electrodes of the driving thin film transistor provided in the second sub pixel.

11. The electroluminescent display device according to claim 10,
wherein the second capacitor lower electrode is overlapped with the first capacitor lower electrode and the first capacitor upper electrode, and
the second capacitor upper electrode is overlapped with the first capacitor lower electrode and the first capacitor upper electrode.

12. The electroluminescent display device according to claim 10,
wherein the source electrode of the driving thin film transistor provided in the second sub pixel is electrically connected with an anode electrode provided in the second sub pixel, and
the second capacitor upper electrode is connected with the anode electrode through a via penetrating through an insulating layer.

13. The electroluminescent display device according to claim 10,
wherein the source electrode of the driving thin film transistor provided in the second sub pixel is electrically connected with a power source line arranged in a first direction, and
the second capacitor upper electrode is connected with the power source line through a via penetrating through an insulating layer.

14. The electroluminescent display device according to claim 10,
wherein an area of the second capacitor lower electrode is larger than an area of the first capacitor lower electrode, and the first capacitor lower electrode is provided with a cut-off area formed in an area where the second capacitor lower electrode is electrically connected with the gate electrode of the driving thin film transistor provided in the second sub pixel.

15. An electroluminescent display device comprising:
a substrate including a first sub pixel and a second sub pixel which are adjacent to each other;
a driving thin film transistor provided in each of the first sub pixel and the second sub pixel, and configured to include a gate electrode, a source electrode, and a drain electrode;
a first capacitor electrically connected with gate and source electrodes of the driving thin film transistor provided in the first sub pixel; and
a second capacitor electrically connected with gate and source electrodes of the driving thin film transistor provided in the second sub pixel,
wherein the first capacitor includes a first capacitor lower electrode, a first capacitor upper electrode, and a first insulating layer between the first capacitor lower electrode and the first capacitor upper electrode,
wherein the second capacitor includes a second capacitor lower electrode, a second capacitor upper electrode, and a second insulating layer between the second capacitor lower electrode and the second capacitor upper electrode, and
wherein the first capacitor lower electrode and the first capacitor upper electrode are overlapped with the second capacitor lower electrode and the second capacitor upper electrode in the first sub pixel, and the first capacitor lower electrode and the first capacitor upper electrode are overlapped with the second capacitor lower electrode and the second capacitor upper electrode in the second sub pixel.

16. The electroluminescent display device according to claim 15, wherein the first capacitor and the second capacitor are provided in different layers on the substrate, and the first insulating layer is provided in a different layer from the second insulating layer.

17. The electroluminescent display device according to claim 16,
wherein
the second capacitor lower electrode is provided above the first capacitor upper electrode.

18. The electroluminescent display device according to claim 17,
wherein the first capacitor lower electrode, the first capacitor upper electrode, the second capacitor lower electrode, and the second capacitor upper electrode are overlapped with one another in each of the first sub pixel and the second sub pixel.

19. The electroluminescent display device according to claim 15, further comprising a bank provided in a boundary between the first sub pixel and the second sub pixel, and an emission layer provided on the bank,
wherein a trench is provided inside the bank, and some portions of the emission layer are disconnectedly provided in the trench.

20. The electroluminescent display device according to claim 15, further comprising:
a lens array which is apart from the substrate; and
a receiving case configured to receive the substrate and the lens array therein.

* * * * *